US012635123B2

(12) United States Patent (10) Patent No.: US 12,635,123 B2
Park et al. (45) Date of Patent: May 19, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jinyoung Park, Anyang-si (KR);
Sangwuk Park, Hwaseong-si (KR);
Hyun-Chul Yoon, Seongnam-si (KR);
Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 834 days.

(21) Appl. No.: 17/807,146

(22) Filed: Jun. 16, 2022

(65) Prior Publication Data

US 2023/0094529 A1 Mar. 30, 2023

(30) Foreign Application Priority Data

Sep. 29, 2021 (KR) ........................ 10-2021-0129249

(51) Int. Cl.
*H10B 12/00* (2023.01)
(52) U.S. Cl.
CPC ........... *H10B 12/30* (2023.02); *H10B 12/482* (2023.02); *H10B 12/488* (2023.02)
(58) Field of Classification Search
CPC .................................................. H10B 12/488
See application file for complete search history.

(56) References Cited

U.S. PATENT DOCUMENTS 7,271,408 B2 9/2007 Kim et al.
9,214,382 B2 12/2015 Lee et al.

9,379,004 B1 6/2016 Kwon et al.
9,607,994 B2 3/2017 Kim et al.
9,786,598 B2 10/2017 Kim et al.
9,865,602 B2 1/2018 Kwon
10,468,350 B2 11/2019 Kim et al.
10,888,167 B2 1/2021 Chun et al.
10,978,397 B2 4/2021 Kim et al.

(Continued)

FOREIGN PATENT DOCUMENTS

KR 10-0363710 12/2002
KR 2018-0018239 A 2/2018
KR 2021-0014018 A 2/2021

OTHER PUBLICATIONS

Office Action dated Jun. 16, 2025 issued in corresponding Korean Patent Application No. 10-2021-0129249.

*Primary Examiner* — Benjamin P Sandvik

(74) *Attorney, Agent, or Firm* — Morgan, Lewis & Bockius LLP

(57) ABSTRACT

A semiconductor memory device includes active sections that include first and second impurity regions and are defined by a device isolation layer. Word lines extend in a first direction on the active sections. Intermediate dielectric patterns cover top surfaces of the word lines. Bit-line structures extend on the word lines in a second direction intersecting the first direction. Contact plugs are disposed between the bit-line structures and are connected to the second impurity regions. Data storage elements are disposed on the contact plugs. The intermediate dielectric pattern includes a capping part that covers the top surfaces of the word lines and is buried in the substrate. Fence parts extend between the bit-line structures from the capping part.

19 Claims, 41 Drawing Sheets

(56) References Cited

U.S. PATENT DOCUMENTS

| | | | |
|---|---|---|---|
| 11,183,500 B2 | 11/2021 | Song et al. | |
| 11,205,652 B2 * | 12/2021 | Lee | H01L 21/7682 |
| 2002/0034093 A1 | 3/2002 | Shiomi | |
| 2007/0152257 A1 * | 7/2007 | Park | H01L 21/76831 |
| | | | 438/399 |
| 2015/0333071 A1 * | 11/2015 | Kim | H01L 21/7682 |
| | | | 438/510 |
| 2016/0307773 A1 * | 10/2016 | Lee | H01L 21/31116 |
| 2018/0040560 A1 * | 2/2018 | Kim | H10B 12/0335 |
| 2019/0122980 A1 * | 4/2019 | Park | H01L 21/0273 |
| 2020/0402982 A1 | 12/2020 | Park et al. | |
| 2021/0035984 A1 | 2/2021 | Ji et al. | |
| 2022/0077002 A1 * | 3/2022 | Yoon | H10B 12/0335 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0129249 filed on Sep. 29, 2021 in the Korean Intellectual Property Office, the disclosure of which is hereby incorporated by reference in its entirety.

TECHNICAL FIELD

The present inventive concepts relate to a semiconductor, and more particularly, to a semiconductor memory device and a method of fabricating the same.

DISCUSSION OF THE RELATED ART

Semiconductor devices are widely used in the electronic industry because of their small size, multi-functionality, and/or low fabrication cost. Semiconductor devices have grown in complexity even as they have become smaller in size. As this happens, line widths of patterns of semiconductor devices are being reduced and new techniques have been developed to be able to create smaller and smaller line widths.

SUMMARY

A semiconductor memory device includes a plurality of active sections that include a plurality of first impurity regions and a plurality of second impurity regions. The active sections are defined by a device isolation layer. A plurality of word lines extend in a first direction on the active sections. A plurality of intermediate dielectric patterns correspondingly cover top surfaces of the word lines. A plurality of bit-line structures extend in a second direction on the word lines. The second direction intersects the first direction. A plurality of contact plugs are disposed between the bit-line structures and are connected to corresponding second impurity regions. A plurality of data storage elements are disposed on corresponding contact plugs. Each of the intermediate dielectric patterns includes a capping part that covers the top surfaces of the word lines and is buried in the substrate, and a plurality of fence parts that extend between the bit-line structures from the capping part.

A semiconductor memory device includes a plurality of active sections that include a plurality of first impurity regions and a plurality of second impurity regions. The active sections are defined by a device isolation layer. A plurality of word lines extend in a first direction on the active sections. A plurality of bit-line structures extend in a second direction on the word lines. The second direction intersects the first direction. A plurality of contact plugs is disposed between the bit-line structures and are connected to corresponding second impurity regions. A plurality of spacers is disposed between the contact plugs and the bit-line structures. A plurality of data storage elements is disposed on corresponding contact plugs. Each of the bit-line structures includes a plurality of contact parts buried in an upper portion of the substrate and connected to corresponding first impurity regions. A line part extends in the second direction and is connected in common to the contact parts. A bottom surface of at least one of the contact parts is at a level that is lower than levels of bottom surfaces of the spacers.

A semiconductor memory device includes a plurality of active sections that include a plurality of first impurity regions and a plurality of second impurity regions. The active sections are defined by a device isolation layer. A plurality of word lines extends in a first direction on the active sections. A gate dielectric layer is disposed between the word lines and the active sections. A plurality of intermediate dielectric patterns correspondingly cover top surfaces of the word lines. A plurality of bit-line structures extends in a second direction on the word lines. The second direction intersects the first direction. A plurality of contact plugs is disposed between the bit-line structures and is connected to corresponding second impurity regions. A plurality of landing pads is disposed on the contact plugs. A gap-fill structure fills a space between the landing pads. A capacitor is connected to the second impurity regions through the contact plugs and the landing pads. Each of the intermediate dielectric patterns includes a capping part that covers the top surfaces of the word lines and is buried in the substrate. A plurality of fence parts extend between the bit-line structures from the capping part.

A method of fabricating a semiconductor memory device includes forming, in a substrate, a device isolation layer to define a plurality of active sections that include a plurality of first impurity regions and a plurality of second impurity regions. In an upper portion of the substrate, a plurality of recess regions that expose corresponding first impurity regions is formed. A plurality of sacrificial dielectric patterns that fill the recess regions is formed. A mold layer that covers the sacrificial dielectric patterns is formed. A plurality of first trenches that penetrate the mold layer and extend in a first direction is formed. The first trenches separate the mold layer into a plurality of preliminary mold patterns that extend in the first direction. A plurality of word lines is formed in lower portions of the first trenches. A plurality of intermediate dielectric patterns that fill the first trenches is formed. A plurality of second trenches that extend in a second direction intersecting the first direction is formed. The second trenches divide the preliminary mold patterns into a plurality of mold patterns that are separated from each other in the first direction. At least portions of the sacrificial dielectric patterns are removed to expose the recess regions. A plurality of bit-line structures that fill corresponding second trenches is formed. Each of the bit-line structures includes a plurality of contact parts that fill the recess regions. A line part connects the contact parts to each other.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 2B is a cross-sectional view taken along lines C1-C2 and D1-D2 of FIG. 1;

FIGS. 5, 8, 10, 13, 16, 19, 21, 24, 26, 29, 32, 34, and 36 are cross-sectional views taken along lines A1-A2 and B1-B2 of previous drawings.

DETAILED DESCRIPTION OF EMBODIMENTS

Semiconductor memory devices and methods of fabricating the same are described in detail below in conjunction with the accompanying drawings.

Figure 1:
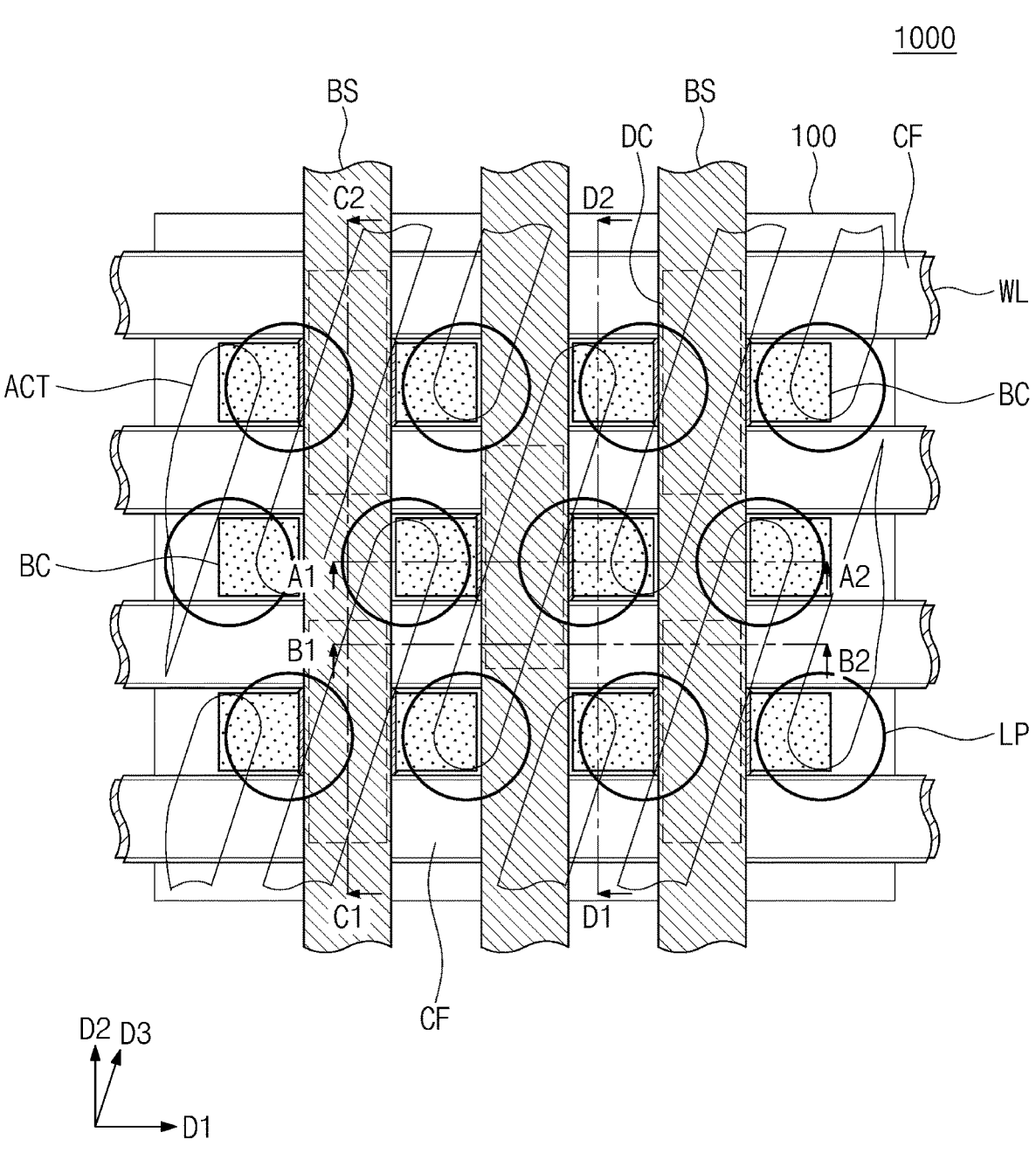
FIG. 1 is a plan view showing a semiconductor memory device according to some embodiments of the present inventive concepts.
Figure 2A:
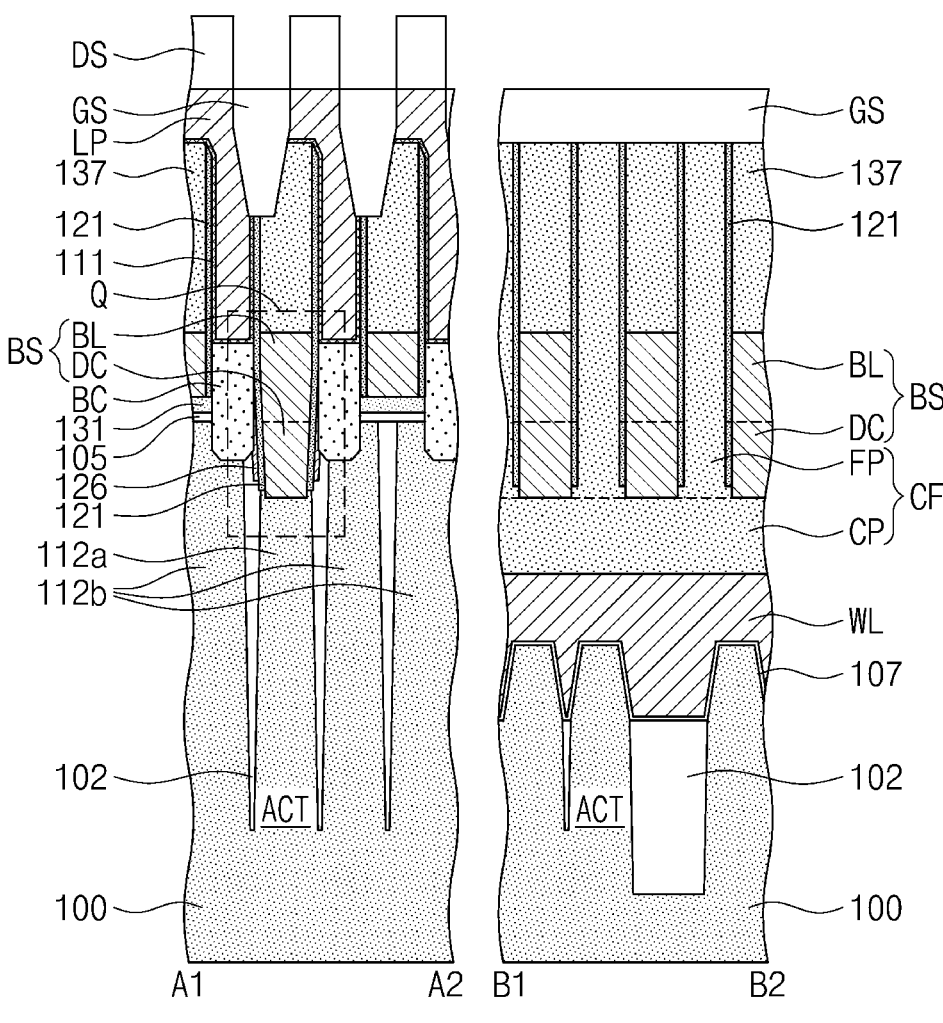
FIG. 2A is a cross-sectional view taken along lines A1-A2 and B1-B2 of FIG. 1.
Figure 2B:
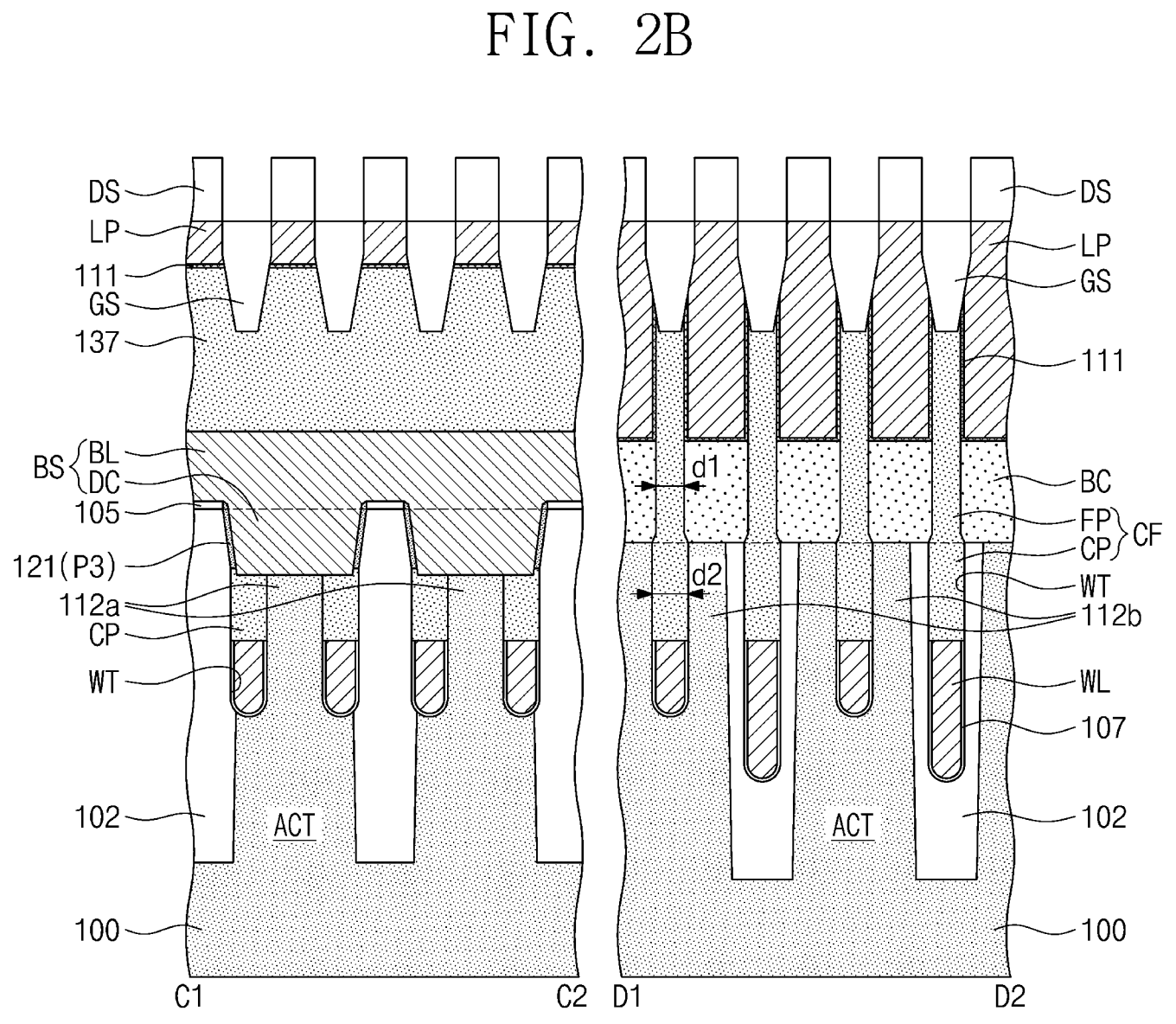

FIG. 1 is a plan view showing a semiconductor memory device 1000 according to some embodiments of the present inventive concepts. FIG. 2A is a cross-sectional view taken along lines A1-A2 and B1-B2 of FIG. 1. FIG. 2B is a cross-sectional view taken along lines C1-C2 and D1-D2 of FIG. 1. FIGS. 3A to 3D are enlarged views showing section Q of FIG. 2A.

Referring to FIGS. 1, 2A, and 2B, active sections ACT may be defined by a device isolation layer 102 disposed in a substrate 100. The substrate 100 may be a semiconductor substrate, such as a single-crystalline silicon substrate. Each of the active sections ACT may have an isolated island shape. Each of the active sections ACT may have a bar shape elongated in a third direction D3. In a plan view, the active sections ACT may correspond to portions of the substrate 100 that are at least partially surrounded by the device isolation layer 102. The active sections ACT may be arranged parallel to each other in the third direction D3, and one of the active sections ACT may have an end that is adjacent to a center of a neighboring one of the active sections ACT.

Word lines WL may run across the active sections ACT. The word lines WL may be disposed in corresponding first trenches WT formed in the device isolation layer 102 and the active sections ACT. The word lines WL may be parallel to a first direction D1 that intersects the third direction D3. The word lines WL may include a conductive material. A gate dielectric layer 107 may be disposed between the word line WL and an inner surface of the first trench WT. The gate dielectric layer 107 may include thermal oxide, silicon nitride, silicon oxynitride, and/or high-k dielectric (where a high-k dielectric is understood to be a material having a dielectric constant greater than silicon dioxide). A single active section ACT may intersect a pair of word lines WL.

A first impurity region 112a may be disposed in the active section ACT between a pair of word lines WL, and a pair of second impurity regions 112b may be disposed in opposite edge portions of the active section ACT. The first and second impurity regions 112a and 112b may be doped with, for example, n-type impurities. The first impurity region 112a may correspond to a common drain region, and the second impurity regions 112b may correspond to source regions. A transistor may be constituted by one of the word lines WL and its adjacent first and second impurity regions 112a and 112b.

The word lines WL may have their top surfaces lower than that of the substrate 100. The word lines WL may have their bottom surfaces each of which is located at a height (or level) that is changed based on a material thereunder. For example, the bottom surface of the word line WL provided on the active section ACT may be located higher than the bottom surface of the word line WL provided on the device isolation layer 102.

Intermediate dielectric patterns CF may extend in the first direction D1 while covering corresponding word lines WL.

Each of the intermediate dielectric patterns CF may include a capping part CP and fence parts FP. The capping part CP may be buried in the substrate 100 and may cover the top surface of the word line WL. An upper portion of each fence part FP may protrude upwardly from the top surface of the substrate 100. For example, the fence parts FP may protrude from the capping part CP in a direction away from the substrate 100 and may extend between bit-line structures which will be discussed below. A lower portion of each fence part FP may be lower than the top surface of the substrate 100, but the present inventive concepts are not necessarily limited thereto.

The capping part CP may have a sidewall that is defined by an inner sidewall of the first trench WT and is aligned with a sidewall of the gate dielectric layer 107. The fence part FP may have opposite sidewalls that have their shapes recessed with respect to opposite sidewalls of the capping part CP. For example, a width d1 in a second direction D2 of the fence part FP may be less than a width d2 in the second direction D2 of the capping part CP.

The intermediate dielectric patterns CF may include, for example, a silicon nitride layer or a silicon oxynitride layer. The fence parts FP and the capping part CP included in each intermediate dielectric pattern CF may be portions of a single layer that are simultaneously formed of the same material. No interface might be present between the capping part CP and the fence parts FP. For example, each intermediate dielectric pattern CF may have a single-body structure or a monolithic structure.

A first buffer dielectric layer 105 and a second buffer dielectric layer 131 may be sequentially provided on the substrate 100. For example, the first buffer dielectric layer 105 may be a silicon oxide layer, and the second buffer dielectric layer 131 may be a silicon nitride layer. Alternatively, one of the first and second buffer dielectric layers 105 and 131 may be provided. Each of the first and second buffer dielectric layers 105 and 131 may have an isolated island shape in a plan view. For example, each of the first and second buffer dielectric layers 105 and 131 may simultaneously cover distal ends of two neighboring active sections ACT.

The following will describe bit-line structures BS with reference to FIGS. 3A to 3D. The word lines WL may be provided thereon with the bit-line structures BS that extend in the second direction D2 intersecting the first direction D1. Each of the bit-line structures BS may include contact parts DC that are buried in an upper portion of the substrate 100 and are connected to the first impurity regions 112a and may also include a line part BL that extends in the second direction D2 and is connected in common to a plurality of contact parts DC. When viewed along a direction perpendicular to the substrate 100, the line part BL may have a thickness that is greater than those of the contact parts DC.

As shown in FIG. 2A, the bit-line structures BS may extend between the fence parts FP on the capping part CP. Bit-line capping patterns 137 may be disposed on corresponding bit-line structures BS. The bit-line capping patterns 137 may include a dielectric material, such as silicon nitride.

A spacer 121 may be provided on opposite sidewalls of the bit-line structure BS. The spacer 121 may extend onto sidewalls of the bit-line capping patterns 137. The spacer 121 may include, for example, silicon nitride, silicon oxide, and/or silicon oxynitride. For example, as shown in FIGS. 3A to 3D, the spacer 121 may include a first spacer layer SS1, a second spacer layer SS2, and a third spacer layer SS3, and the second spacer layer SS2 formed of silicon oxide may be provided between the first and third spacer layers SS1 and SS3 formed of silicon nitride. Alternatively, the second spacer layer SS2 may be replaced with an air gap.

Figure 3A:
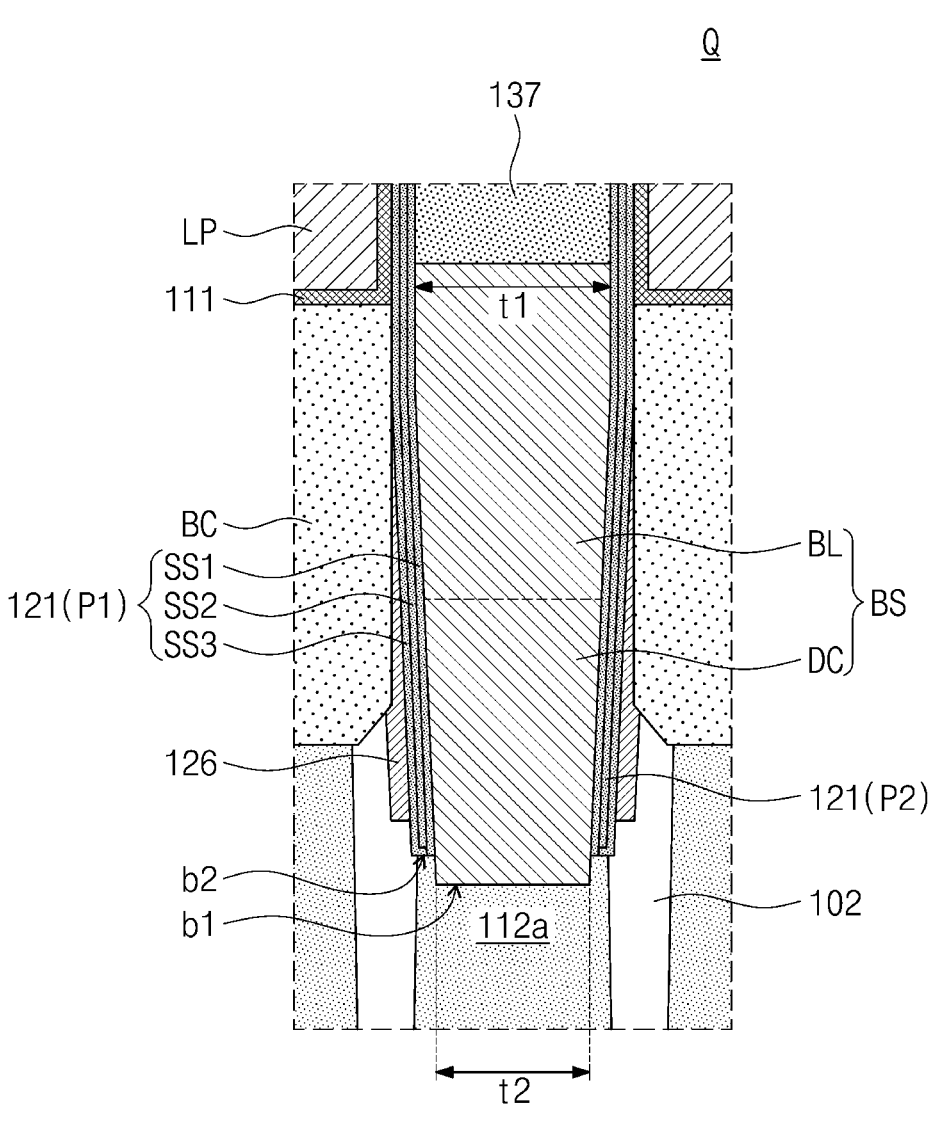
FIGS. 3A to 3D are enlarged views showing section Q of FIG. 2A.

The spacer 121 may extend in the second direction D2 along the bit-line structure BS. For example, as shown in FIG. 3A, the spacer 121 may include a first part P1 that covers one sidewall of the bit-line structure BS, a second part P2 that covers another sidewall of the bit-line structure BS, and a third part (see P3 of FIG. 2B) that connects the first and second parts P1 and P2 to each other. The first and second parts P1 and P2 of the spacer 121 may cover sidewalls of the contact part DC that extend in the second direction D2 and are exposed in the first direction D1 and its opposite direction. Similarly, the first and second parts P1 and P2 of the spacer 121 may cover sidewalls of the line part BL that extend in the second direction D2 and are exposed in the first direction D1 and its opposite direction. As shown in FIG. 2B, below the line part BL, the third part P3 of the spacer 121 may cover a sidewall exposed in the second direction D2 of the contact part DC and may also cover a sidewall exposed in an opposite direction to the second direction D2 of the contact part DC. The third part P3 may connect the first part P1 to the second part P2. For example, the contact part DC may be at least partially surrounded by the spacer 121 having a circular, oval, or rectangular ring/frame shape in a plan view.

As shown in FIG. 3A, a lower width t2 of the bit-line structure BS may be less than an upper width t1 of the bit-line structure BS. For example, a ratio of the upper width t1 to the lower width t2 of the bit-line structure BS may be greater than about 1.0 and less than about 1.8. For example, a width in the first direction D1 of the bit-line structure BS may successively decrease within at least a partial period and in a direction from top to bottom surfaces of the bit-line structure BS. As shown in FIG. 2B, a width in the second direction D2 of the contact part DC may decrease in a direction from upper to lower portions of the contact part DC.

The contact part DC and the line part BL may be portions of a single layer that are simultaneously formed of the same material. For example, the bit-line structure BS may be a metal layer including tungsten, titanium, and/or tantalum. No interface might be present between the contact part DC and the line part BL. For example, the bit-line structure BS may have a single-body structure or a monolithic structure. For example, the bit-line structure BS might not include a semiconductor material, such as silicon.

Figure 3B:
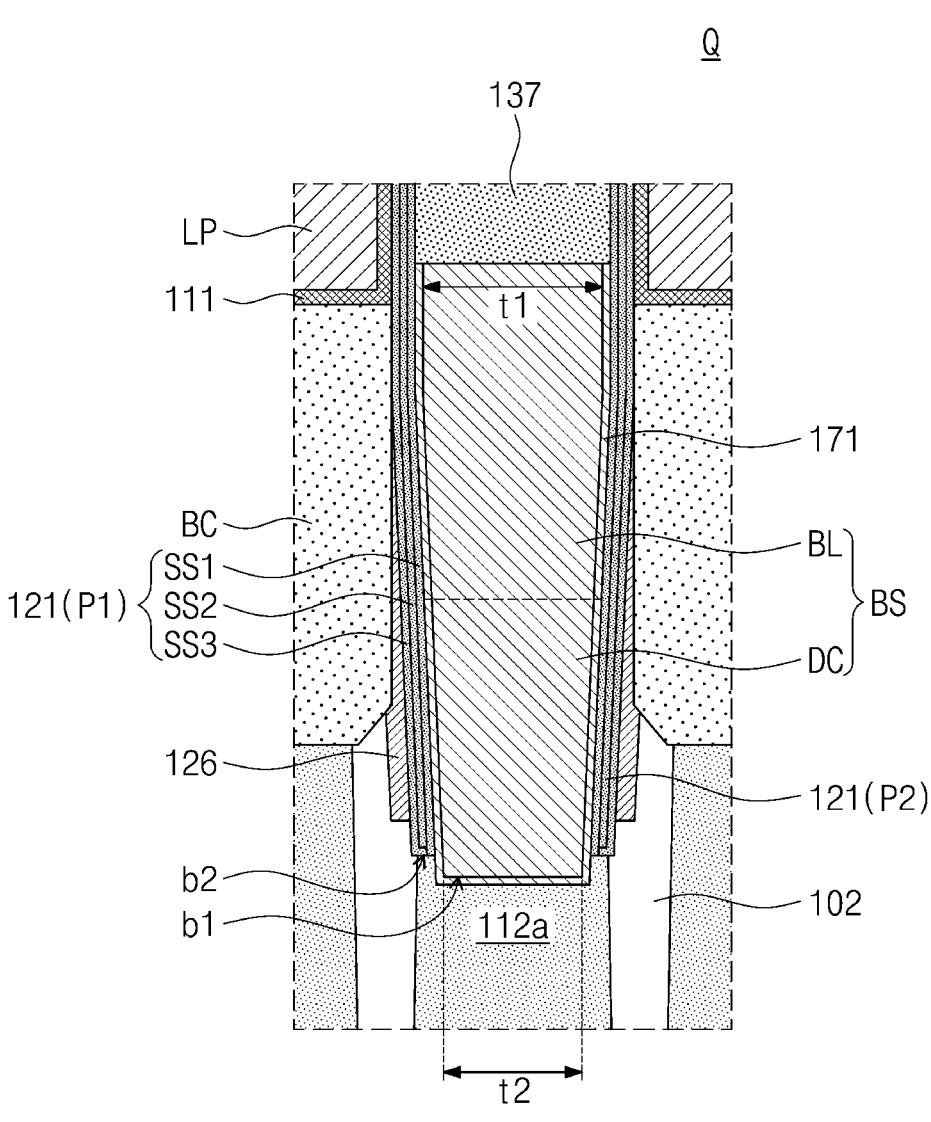
Figure 3C:
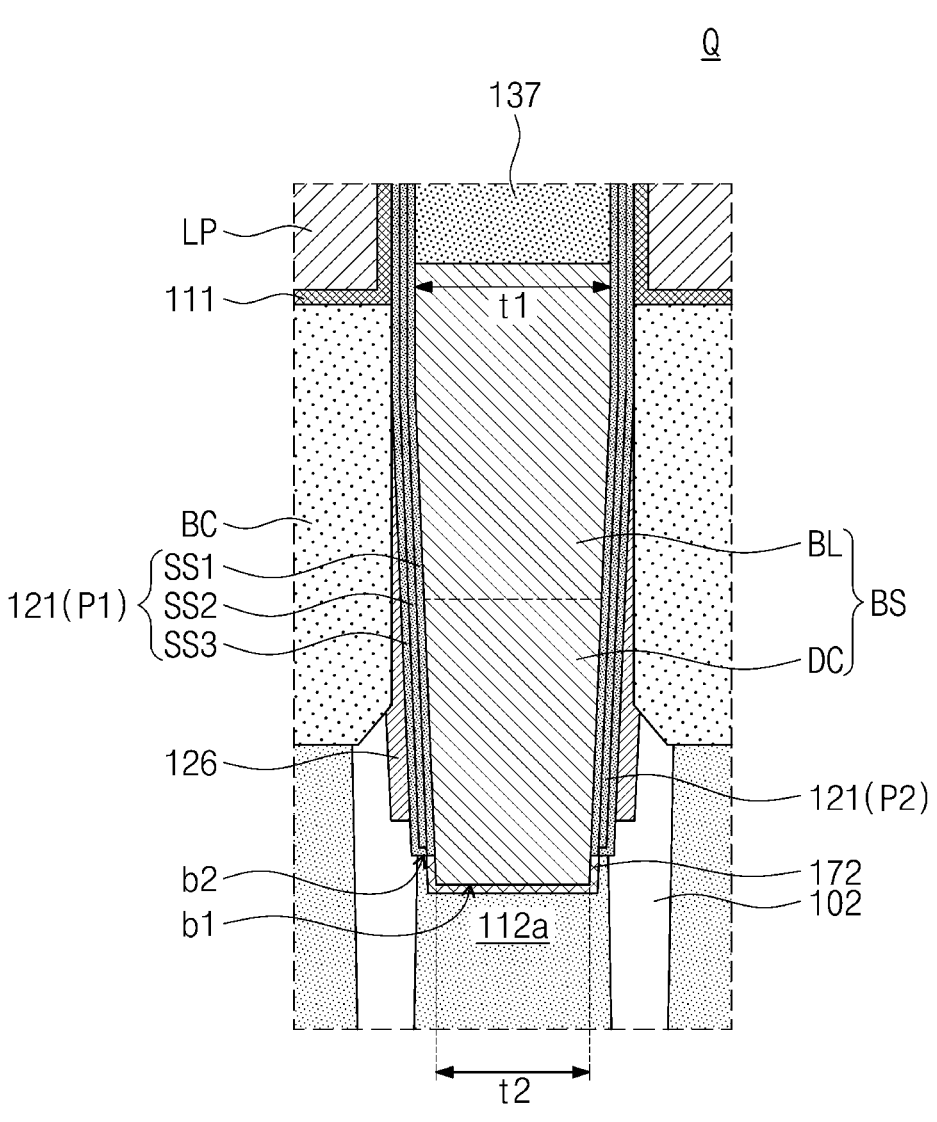
Figure 3D:
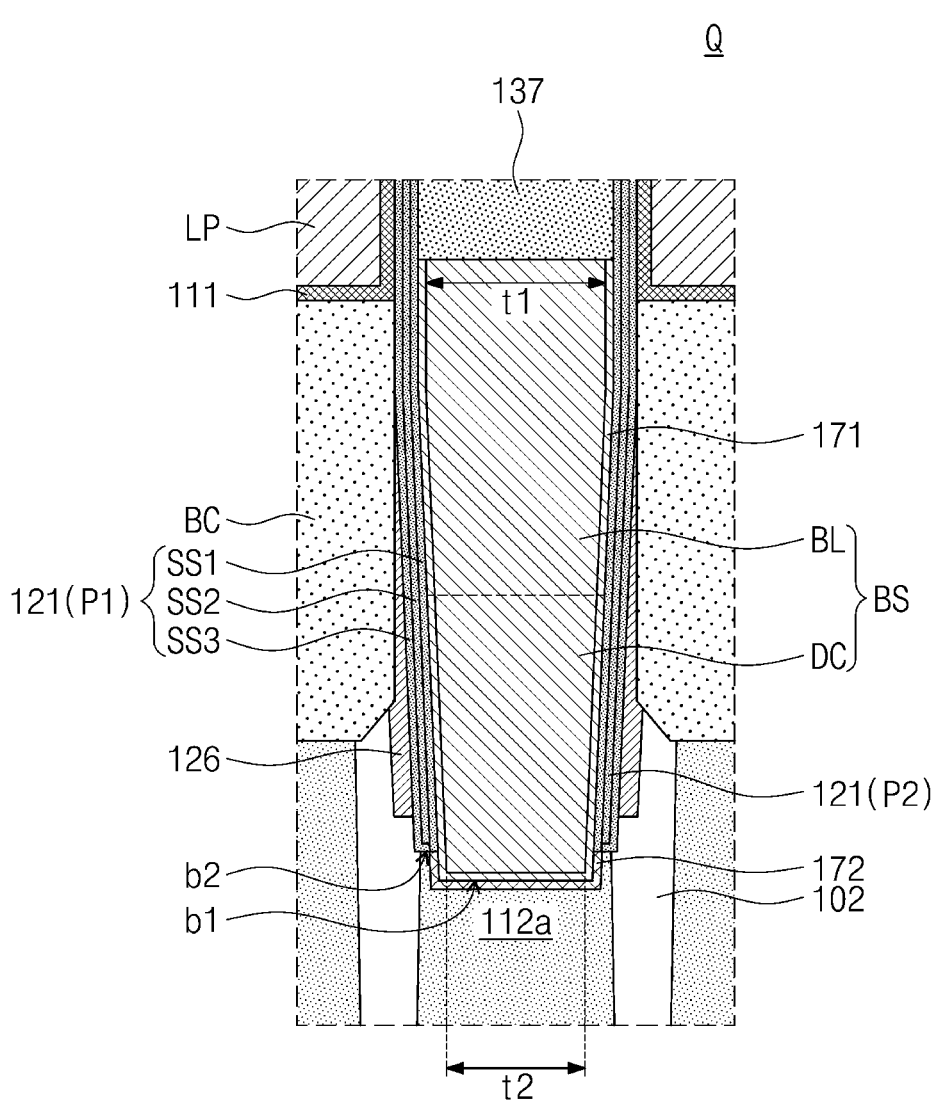

As shown in FIGS. 3A to 3D, a bottom surface b1 of the contact part DC may be lower than a bottom surface b2 of the spacer 121. For example, the contact part DC may protrude toward the first impurity regions 112a from the bottom surface b2 of the spacer 121. As shown in FIG. 3A, the bit-line structure BS may be in direct contact with the first impurity regions 112a, but the present inventive concepts are not necessarily limited thereto. For example, referring to FIG. 3B, a barrier layer 171 may cover bottom and lateral surfaces of the bit-line structure BS. The barrier layer 171 may include a conductive metal nitride layer, such as a tungsten nitride layer, a titanium nitride layer, and/or a tantalum nitride layer. As shown in FIG. 3C, a metal silicide layer 172 may cover the bottom surface of the bit-line structure BS. The metal silicide layer 172 may include titanium silicide, cobalt silicide, and/or nickel silicide. As shown in FIG. 3D, the metal silicide layer 172 and the barrier layer 171 may each be provided. In this case, the barrier layer 171 may be provided between the metal silicide layer 172 and the bit-line structure BS.

Contact plugs BC may be disposed between a pair of neighboring bit-line structures BS. The contact plugs BC may include impurity-doped polysilicon, impurity-undoped polysilicon, and/or metal. As shown in FIG. 1, a plurality of contact plugs BC may be spaced apart from each other. For example, the contact plugs BC arranged along the first direction D1 may be spaced apart from each other across the bit-line structures BS. The contact plugs BC arranged along the second direction D2 may be spaced apart from each other across the fence parts FP of the intermediate dielectric patterns CF. The fence parts FP may have their top surfaces higher than those of the contact plugs BC.

Each of the contact plugs BC may be spaced apart from an adjacent bit-line structure BS across the spacer 121. A residual molding layer 126 may be provided between the contact plug BC and the spacer 121. The residual molding layer 126 may have a bottom surface that is lower than that of the contact plug BC. The bottom surface of the residual molding layer 126 may be higher than a bottom surface of the spacer 121. The residual molding layer 126 may include a silicon nitride layer or a silicon oxynitride layer.

Landing pads LP may be disposed on corresponding contact plugs BC. The landing pads LP may include a material containing metal, such as tungsten. The landing pads LP may be electrically connected to corresponding contact plugs BC. The landing pad LP may have an upper portion that covers a top surface of the bit-line capping pattern 137 and has a width greater than that of the contact plug BC. As shown in FIG. 1, a center of the landing pad LP may be shifted from a center of the contact plug BC in the first direction D1 or in a direction opposite to the first direction D1. A portion of the line part BL may vertically overlap the landing pad LP. An ohmic layer may be provided between the contact plugs BC and the landing pads LP. The ohmic layer may be a metal silicide layer.

A diffusion stop layer 111 may be provided between the contact plugs BC and the landing pads LP. The diffusion stop layer 111 may include conductive metal nitride, such as tungsten nitride, titanium nitride, or tantalum nitride. A gap-fill structure GS may fill a space between the landing pads LP. The gap-fill structure GS may be provided in a recess region defined by sidewalls of the landing pads LP and sidewalls of the bit-line capping patterns 137. In a plan view, the gap-fill structure GS may have a shape that fills a space between the landing pads LP that are spaced apart from each other. For example, when viewed in pan, the gap-fill structure GS may have a mesh shape that includes holes through which the landing pads LP penetrate. The gap-fill structure GS may include silicon oxide.

A data storage element DS may be provided on each of the landing pads LP. When a dynamic random-access memory (DRAM) is given as a semiconductor memory device, according to some embodiments of the present inventive concepts, the data storage element DS may include a capacitor. For example, the data storage element DS may include bottom electrodes, a top electrode, and a dielectric layer.

According to some embodiments of the present inventive concepts, there may be provided a bit-line structure in which a contact part and a line part are integrally connected into a single unitary piece. The bit-line structure of the present inventive concepts may be formed of a metallic material to reduce resistance, compared to a case where a semiconductor material is used to form a contact that connects a bit line to an impurity region. In addition, it may be possible to reduce the number of process steps and to avoid process failure issues that can occur when the contact and the bit line are formed independently of each other.

FIGS. 4, 7, 12, 15, 18, 23, 28, and 31 are plan views showing a method of fabricating a semiconductor device according to some embodiments of the present inventive concepts. FIGS. 5, 8, 10, 13, 16, 19, 24, 26, 29, 32, 34, and 36 are cross-sectional views taken along lines A1-A2 and B1-B2 of previous drawings. FIGS. 6, 9, 11, 14, 17, 20, 25, 27, 30, 34, 35, and 37 are cross-sectional views taken along lines C1-C2 and D1-D2 of previous drawings.

Figure 4:
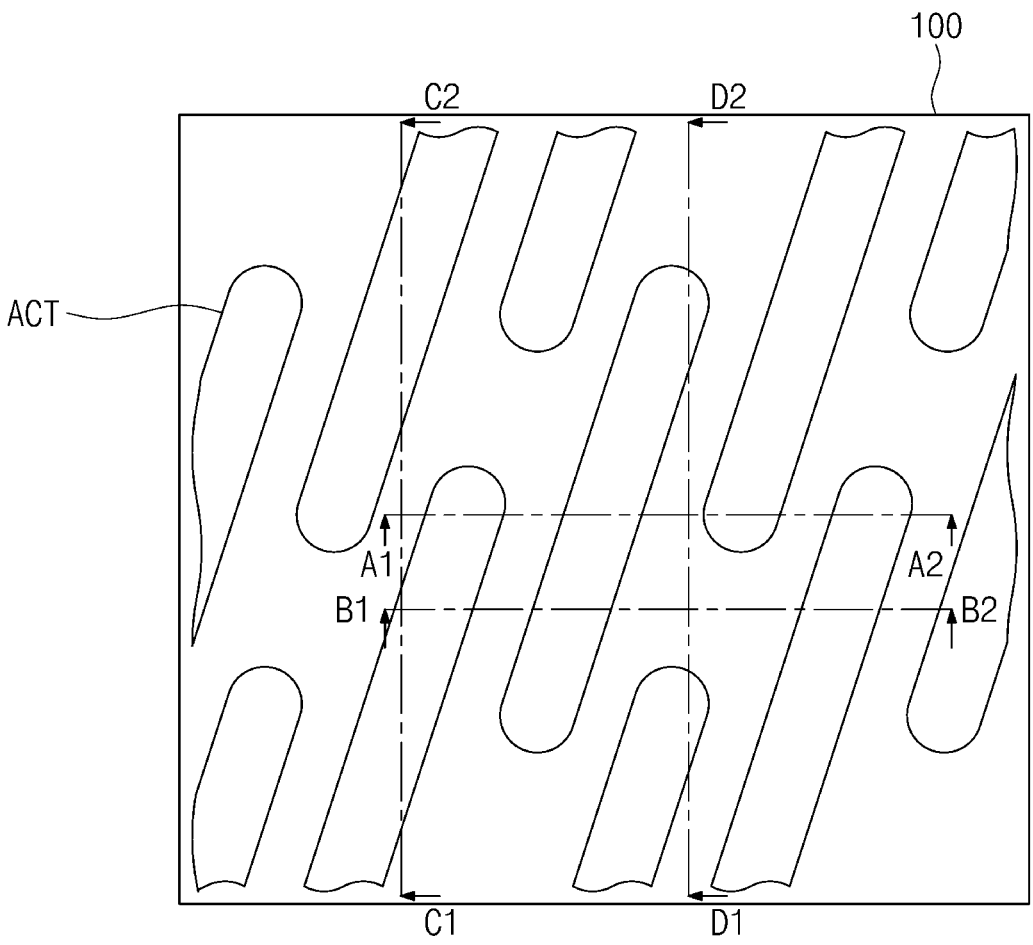
FIGS. 4, 7, 12, 15, 18, 23, 28, and 31 are plan views showing a method of fabricating a semiconductor device according to some embodiments of the present inventive concepts.
Figure 4:
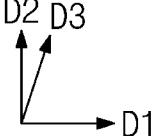
Figure 5:
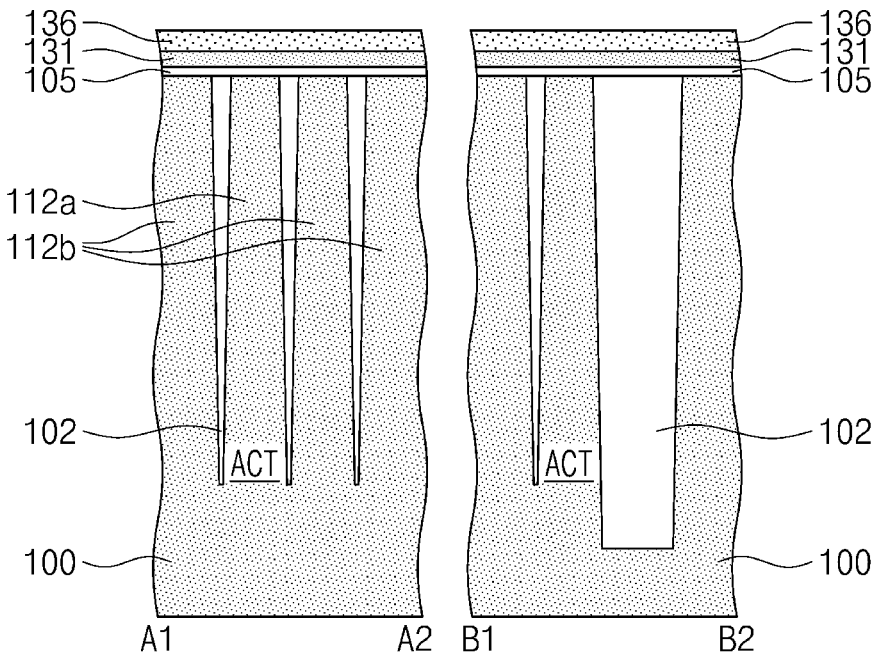
Figure 6:
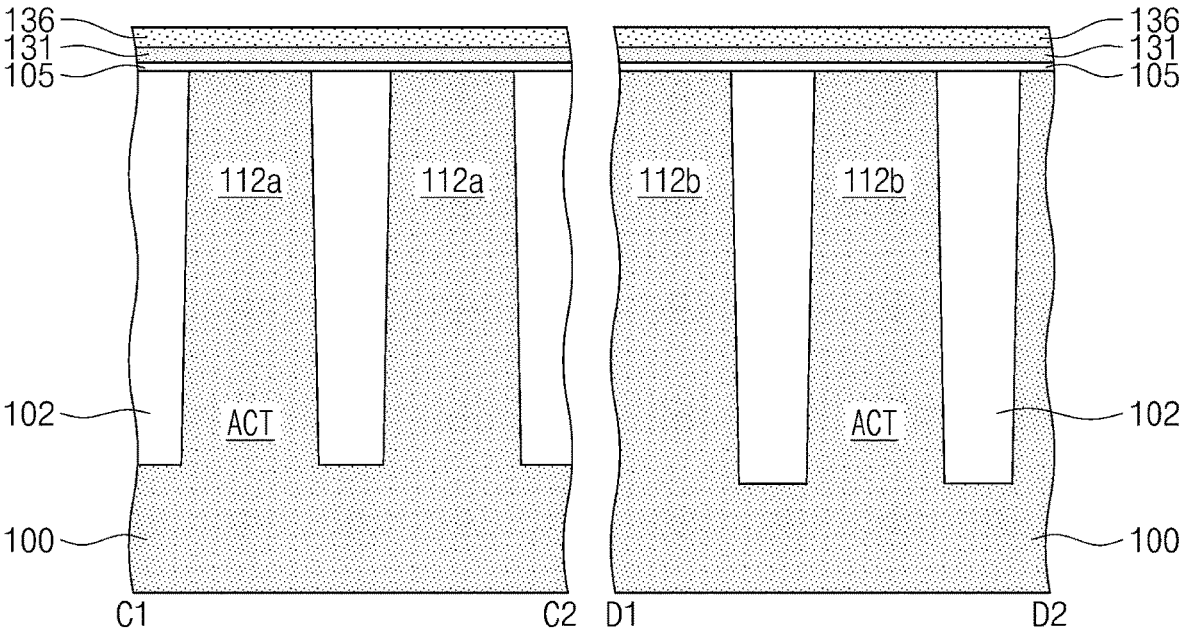
FIGS. 6, 9, 11, 14, 17, 20, 22, 25, 27, 30, 33, 35, and 37 are cross-sectional views taken along lines C1-C2 and D1-D2 of previous drawings.

Referring to FIGS. 4 to 6, active sections ACT may be defined by forming a device isolation layer 102 in a substrate 100. For example, grooves may be formed in the substrate 100, and the grooves may be filled with a dielectric material to form the device isolation layer 102. The device isolation layer 102 may have a depth that is changed based on a distance between the active sections ACT. The device isolation layer 102 may be formed of, for example, silicon oxide.

A first buffer dielectric layer 105 and a second buffer dielectric layer 131 may be sequentially formed on the substrate 100 in which the device isolation layer 102 is formed. For example, the first buffer dielectric layer 105 may be a silicon oxide layer, and the second buffer dielectric layer 131 may be a silicon nitride layer. The second buffer dielectric layer 131 may be thicker than the first buffer dielectric layer 105. The second buffer dielectric layer 131 may have a thickness in the range of about 150 Å to about 250 Å.

Impurities may be doped into the active sections ACT. Therefore, first and second impurity regions 112*a* and 112*b* may be formed in the active sections ACT. The first and second impurity regions 112*a* and 112*b* may have a conductivity type that is different from that of the substrate 100. For example, when the substrate 100 is p-type, each of the first and second impurity regions 112*a* and 112*b* may be n-type.

A first etch stop layer 136 may be formed on the second buffer dielectric layer 131. The first etch stop layer 136 may be formed of a material having an etch selectivity with respect to the first buffer dielectric layer 105 and the second buffer dielectric layer 131. For example, the first etch stop layer 136 may include a polycrystalline silicon layer. The first etch stop layer 136 may be thicker than each of the first and second buffer dielectric layers 105 and 131. For example, the first etch stop layer 136 may have a thickness in the range of about 200 Å to about 400 Å.

Figure 7:
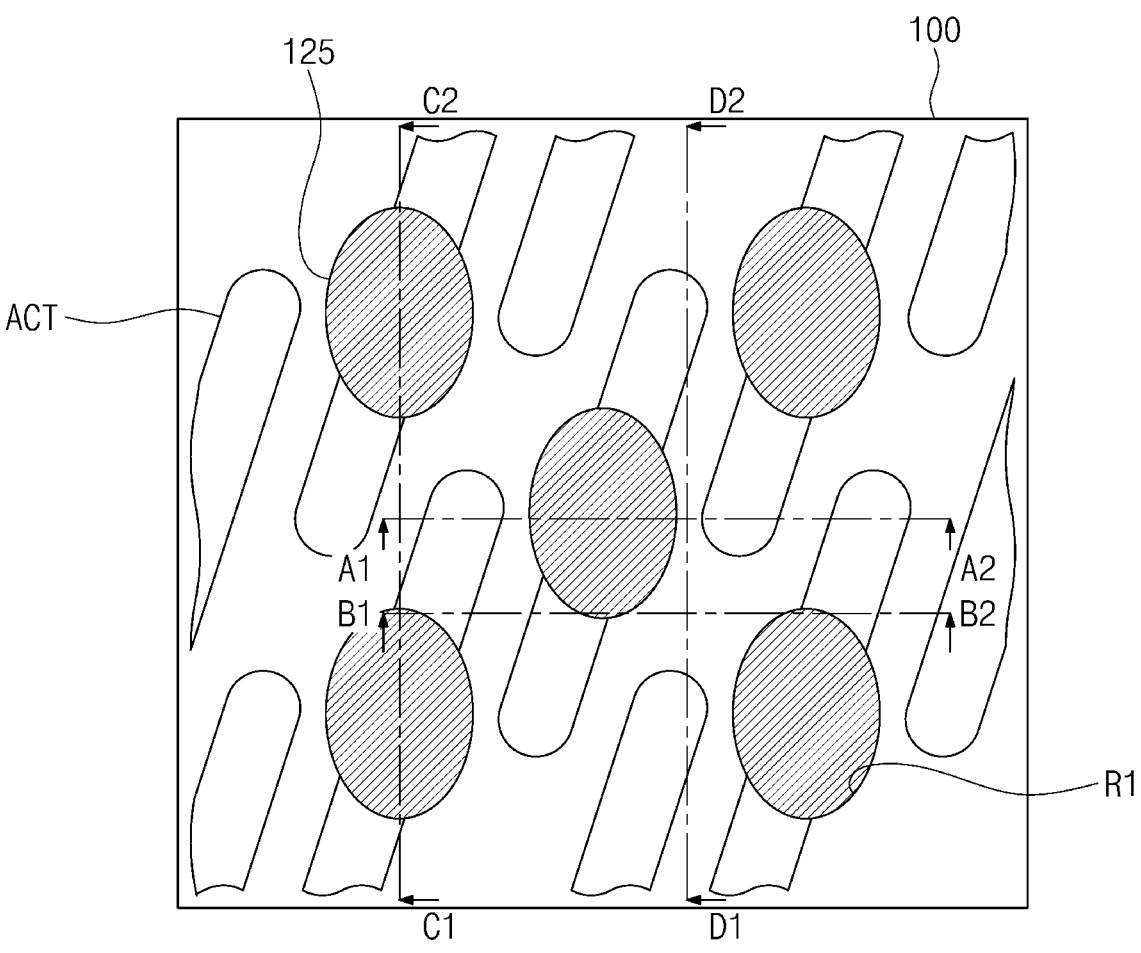
Figure 7:
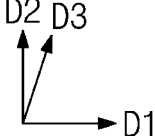
Figure 8:
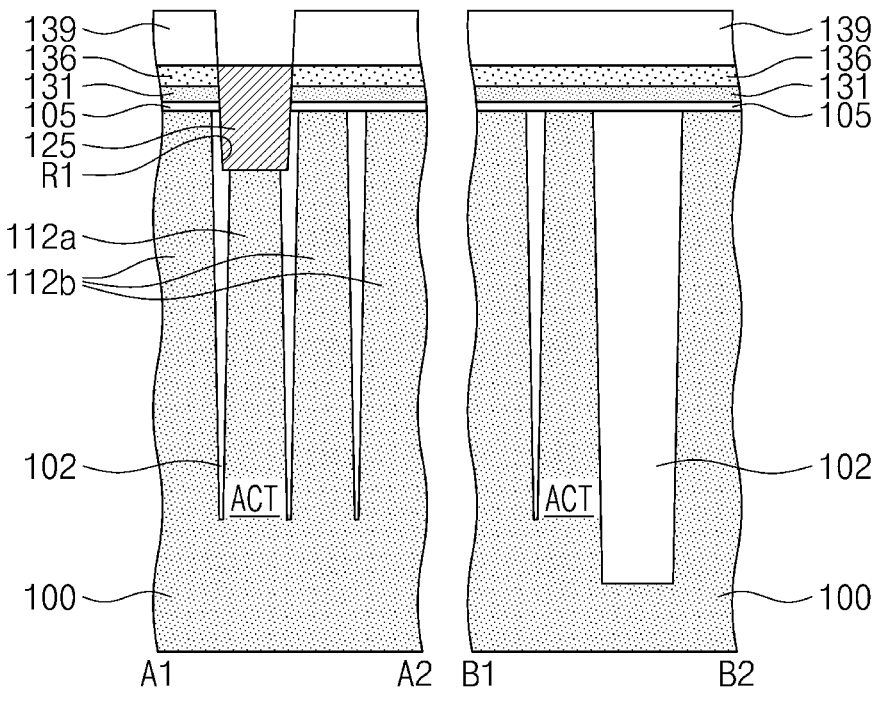
Figure 9:
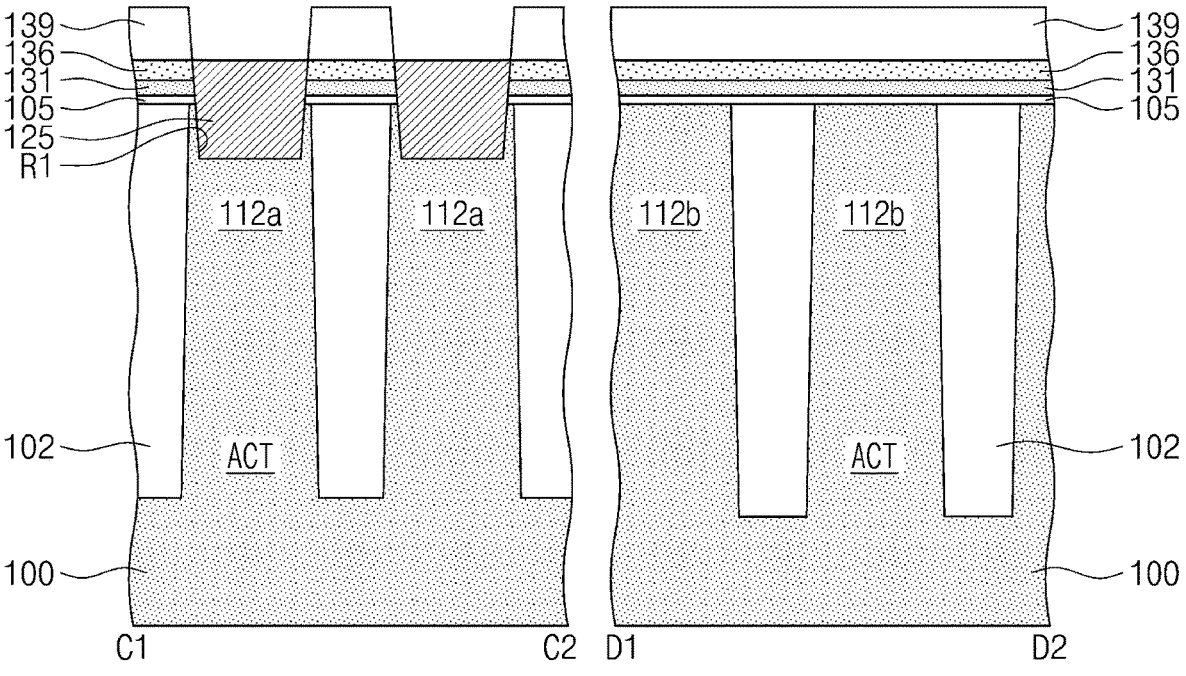

Referring to FIGS. 7 to 9, a first mask pattern 139 may be formed on the first etch stop layer 136, and then the first mask pattern 139 may be used as an etching mask to form first recess regions R1 that penetrate an upper portion of the substrate 100, the first buffer dielectric layer 105, the second buffer dielectric layer 131, and the first etch stop layer 136. The first mask pattern 139 may include silicon oxide and/or silicon oxynitride. An annealing process may be performed after the etching process is executed. The first recess regions R1 may correspondingly expose the first impurity regions 112*a*. Although the first recess regions R1 are illustrated as having a circular shape or an oval shape, the present inventive concepts are not necessarily limited thereto.

Sacrificial dielectric patterns 125 may fill the first recess regions R1. For example, the sacrificial dielectric patterns 125 may include silicon nitride and/or silicon oxynitride. An etch-back process may be employed to form the sacrificial dielectric patterns 125.

Figure 10:
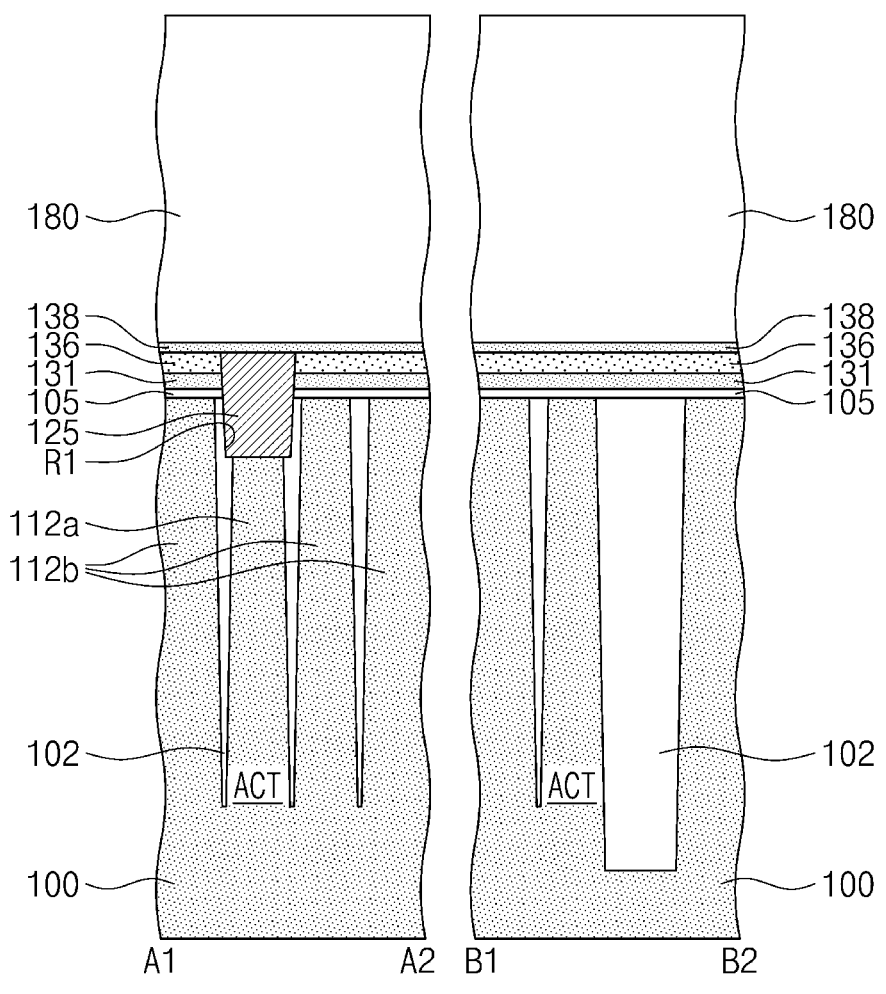
Figure 11:
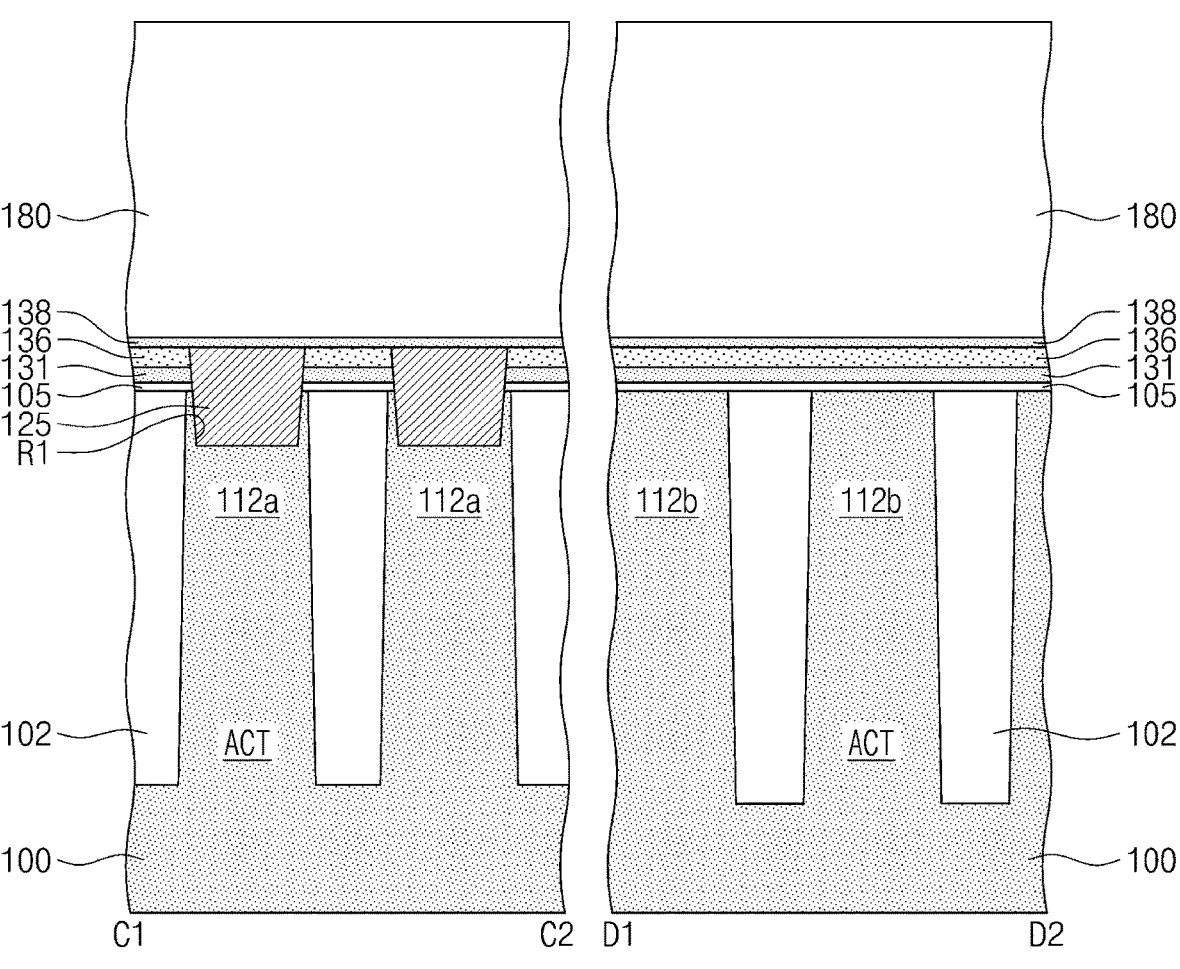

Referring to FIGS. 10 and 11, a wet etching process may be utilized to remove the first mask pattern 139, and then a second etch stop layer 138 may cover the first etch stop layer 136 and the sacrificial dielectric patterns 125. The second etch stop layer 138 may be formed of a material having an etch selectivity with respect to the first etch stop layer 136. For example, the second etch stop layer 138 may include a silicon nitride layer and/or a silicon oxynitride layer. The second etch stop layer 138 may be formed thinner than the first etch stop layer 136. A mold layer 180 may be formed on the second etch stop layer 138. The mold layer 180 may include a silicon oxide layer and/or a silicon oxynitride layer.

Figure 12:
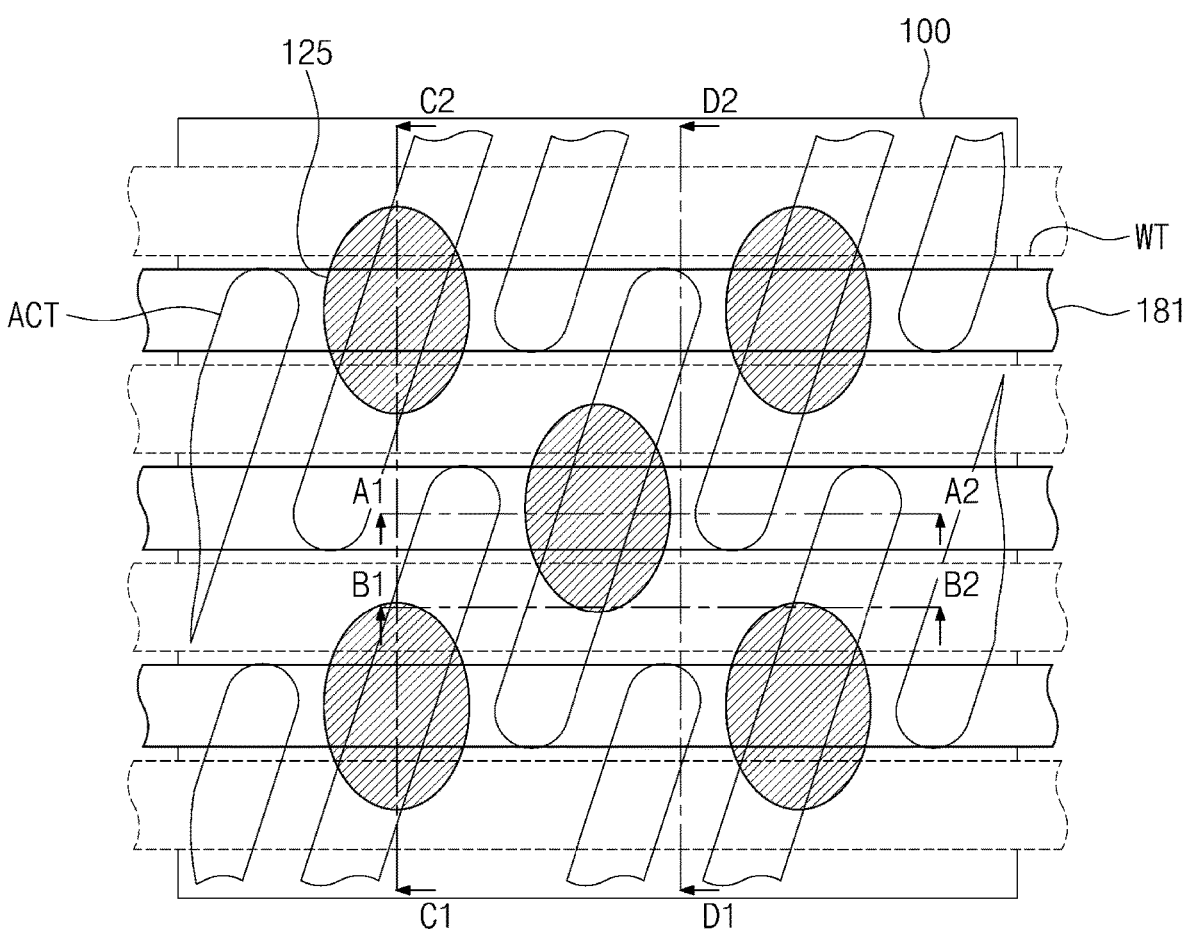
Figure 12:
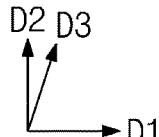
Figure 13:
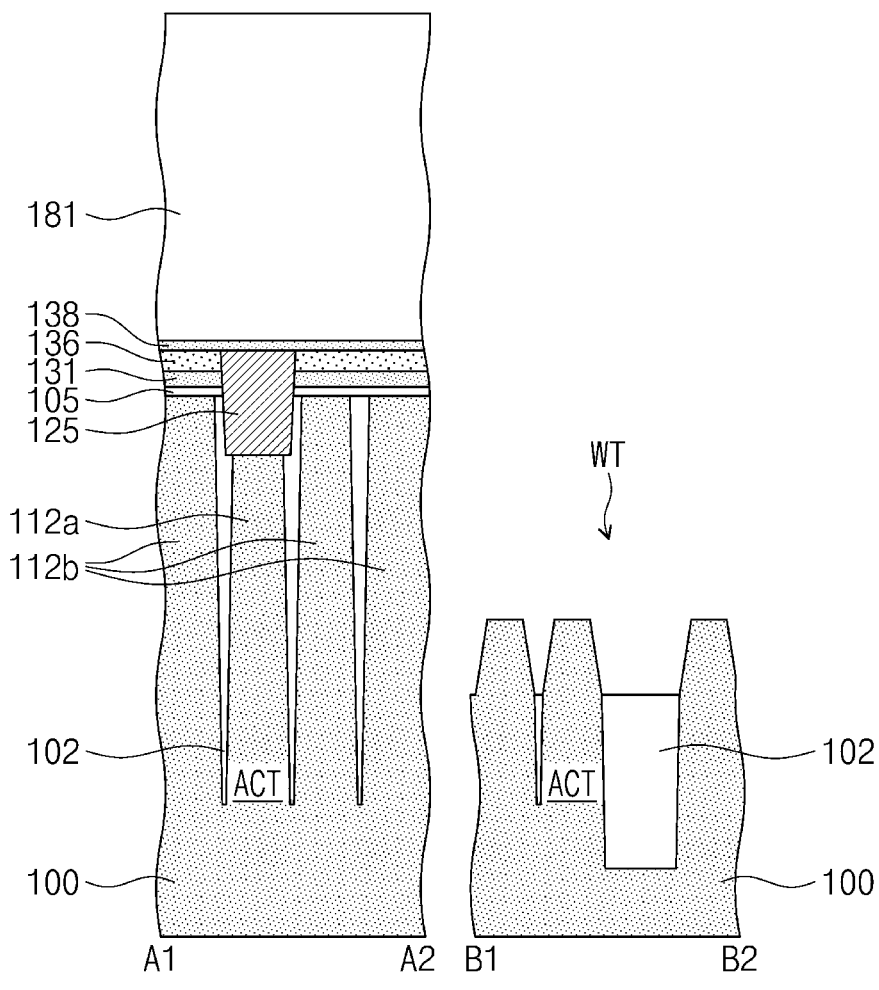
Figure 14:
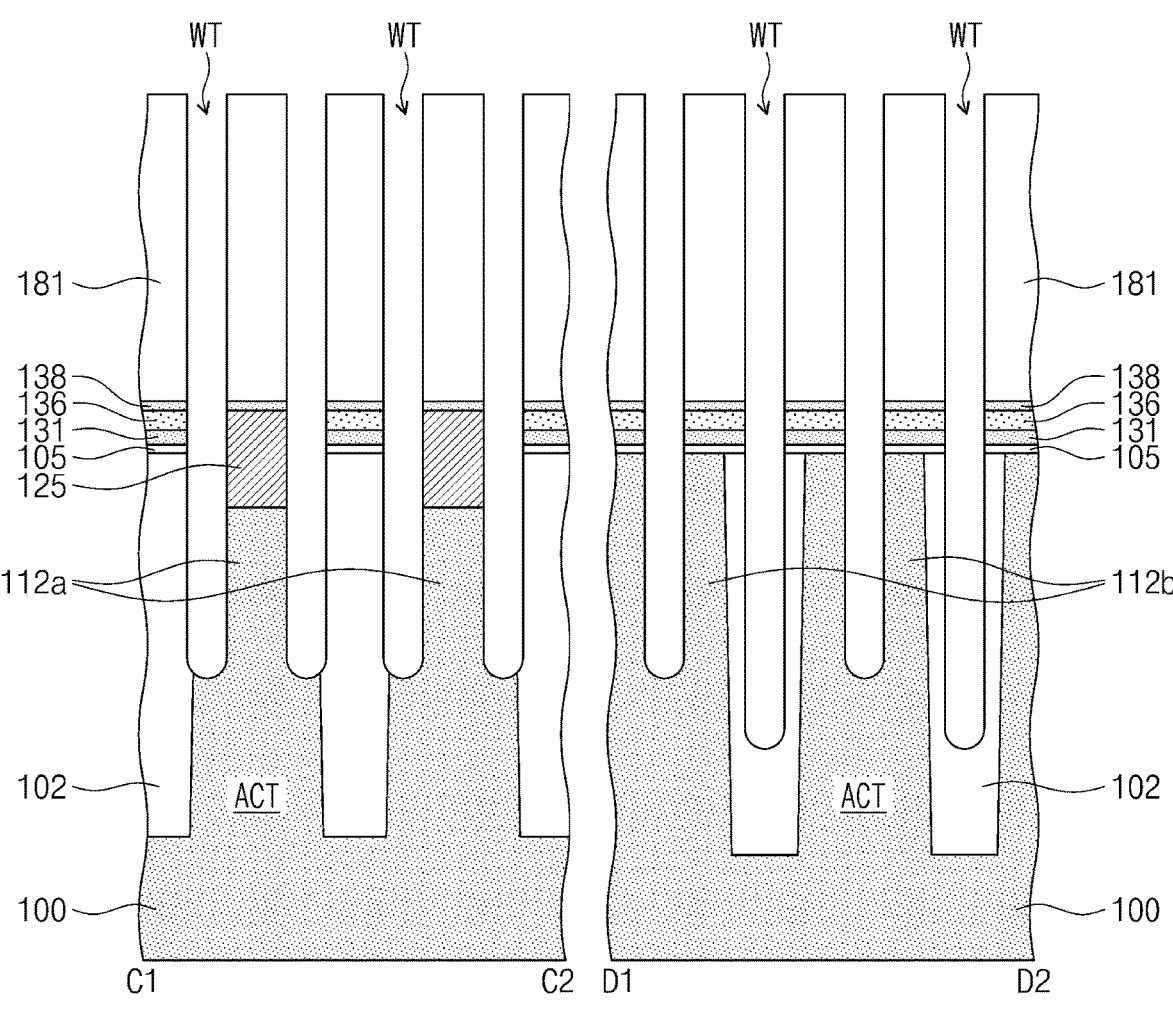

Referring to FIGS. 12 to 14, the mold layer 180 may undergo an anisotropic etching process to form first trenches WT. The first trenches WT may separate the mold layer 180 into preliminary mold patterns 181. The first trenches WT and the preliminary mold patterns 181 may each extend in a first direction D1. The first trenches WT may extend into the device isolation layer 102 and an upper portion of the substrate 100 while penetrating the second etch stop layer 138, the first etch stop layer 136, the second buffer dielectric layer 131, the first buffer dielectric layer 105, and the sacrificial dielectric patterns 125. The first trenches WT may have their bottom surfaces each of whose heights (or levels) is changed based on a material below the bottom surface of the first trench WT. For example, the device isolation layer 102 may be etched at a higher rate than that of the substrate 100.

Figure 15:
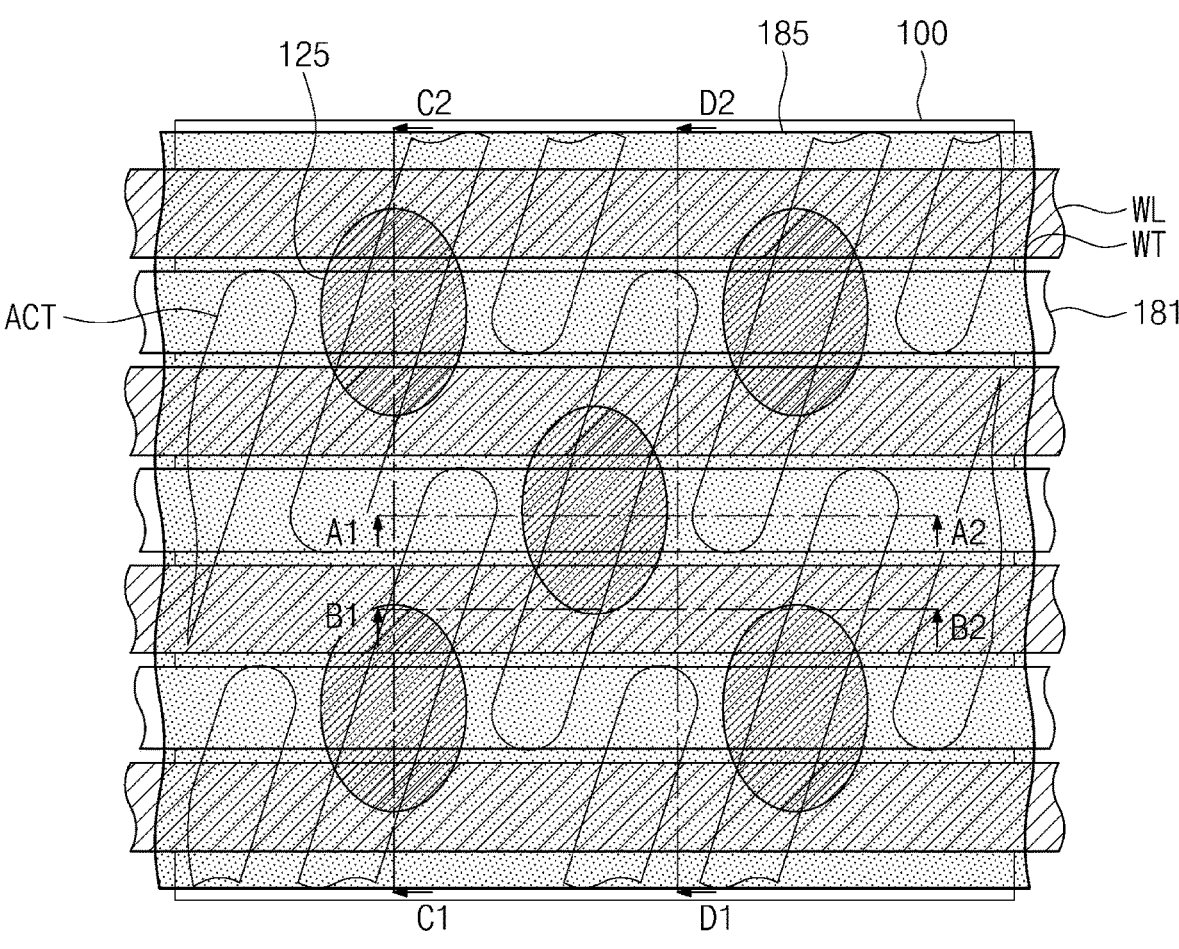
Figure 15:
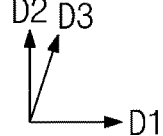
Figure 16:
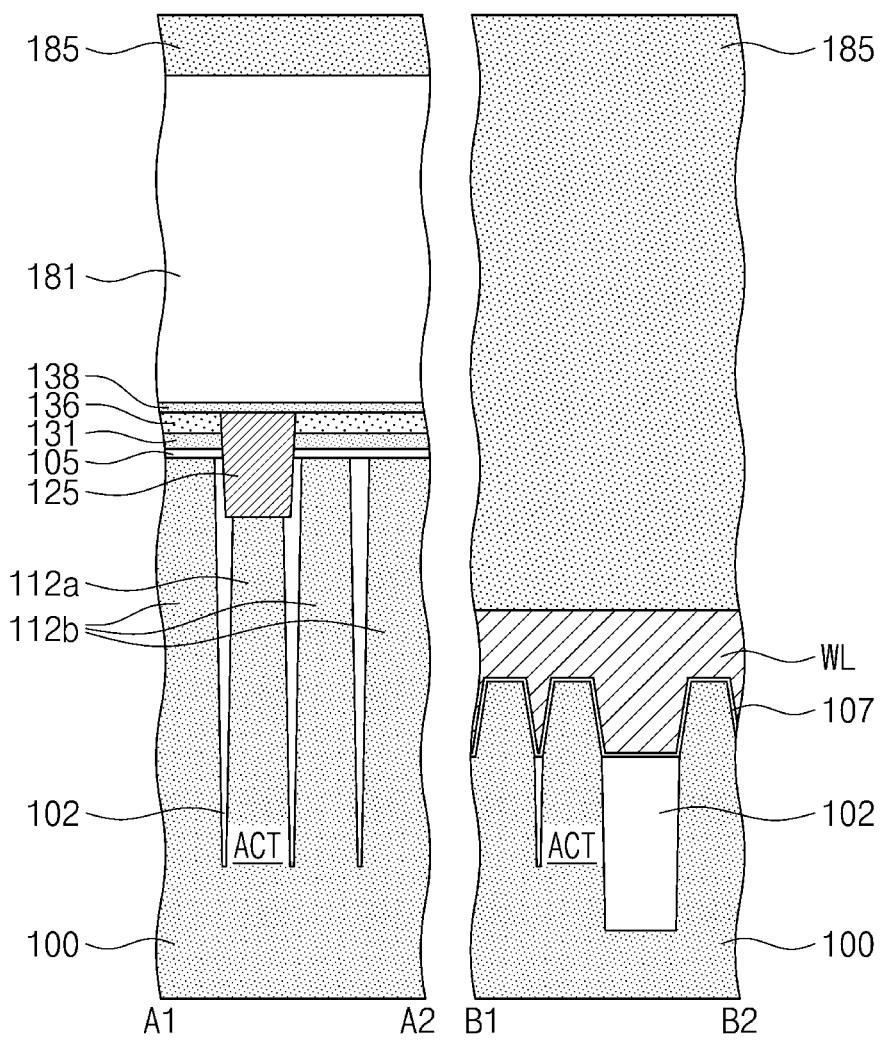
Figure 17:
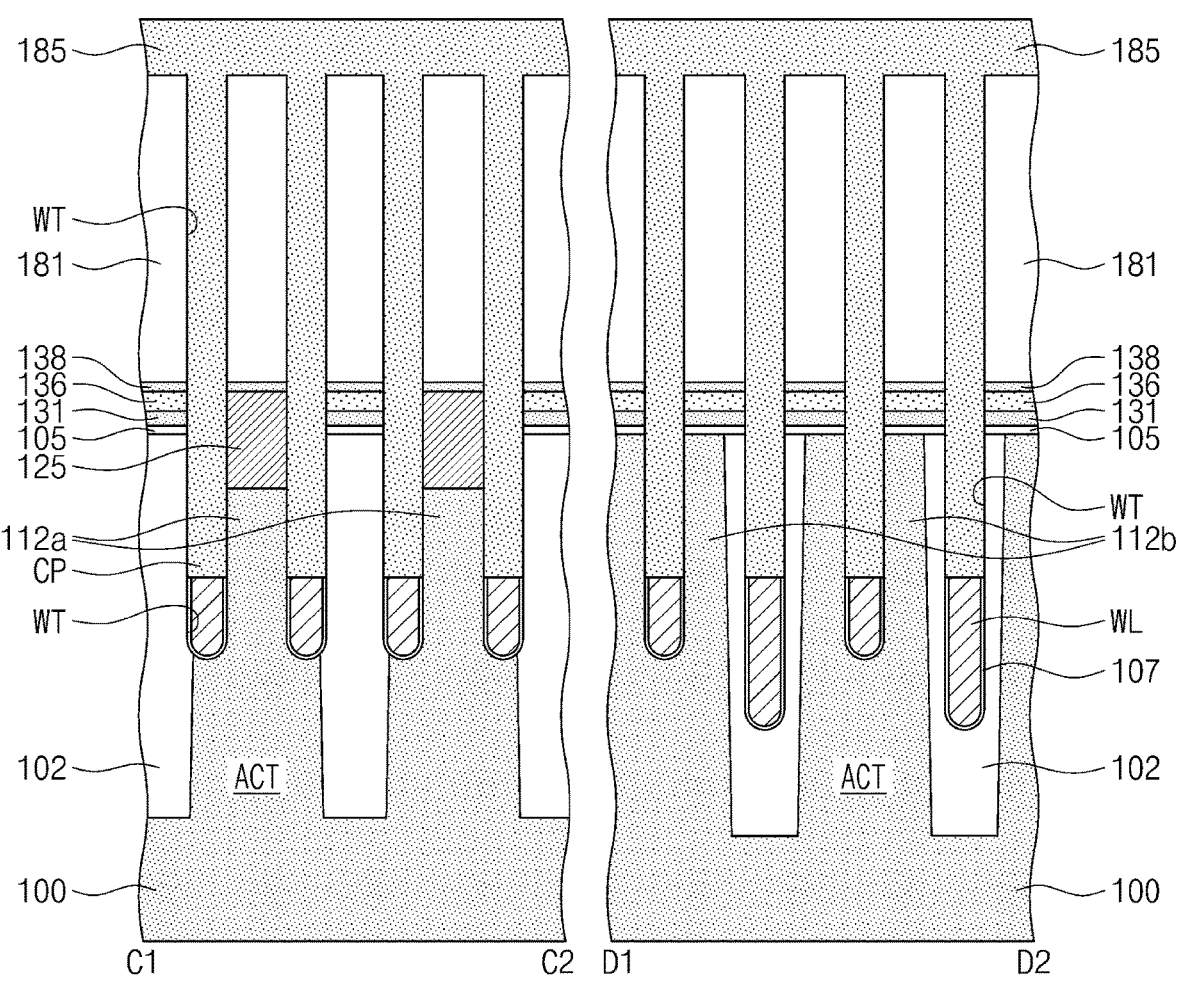

Referring to FIGS. 15 to 17, word lines WL may be correspondingly formed in the first trenches WT. A pair of word lines WL may run across corresponding active sections ACT. Before the formation of the word lines WL, a gate dielectric layer 107 may be formed in an inner surface of each of the first trenches WT. The gate dielectric layer 107 may be formed by a thermal oxidation process, a chemical vapor deposition process, and/or an atomic layer deposition process. On the substrate 100, a conductive layer may be stacked to fill the first trenches WT, and then an etch-back process or a chemical mechanical polishing process may be performed to form the word lines WL in the first trenches WT. The word lines WL may be recessed to have their top surfaces lower than those of the active sections ACT.

An intermediate dielectric layer 185 may fill unoccupied portions of the first trenches WT. The intermediate dielectric layer 185 may be in contact with the top surfaces of the word lines WL. The intermediate dielectric layer 185 may include a silicon nitride layer and/or a silicon oxynitride layer. The intermediate dielectric layer 185 may cover the preliminary mold patterns 181.

Figure 18:
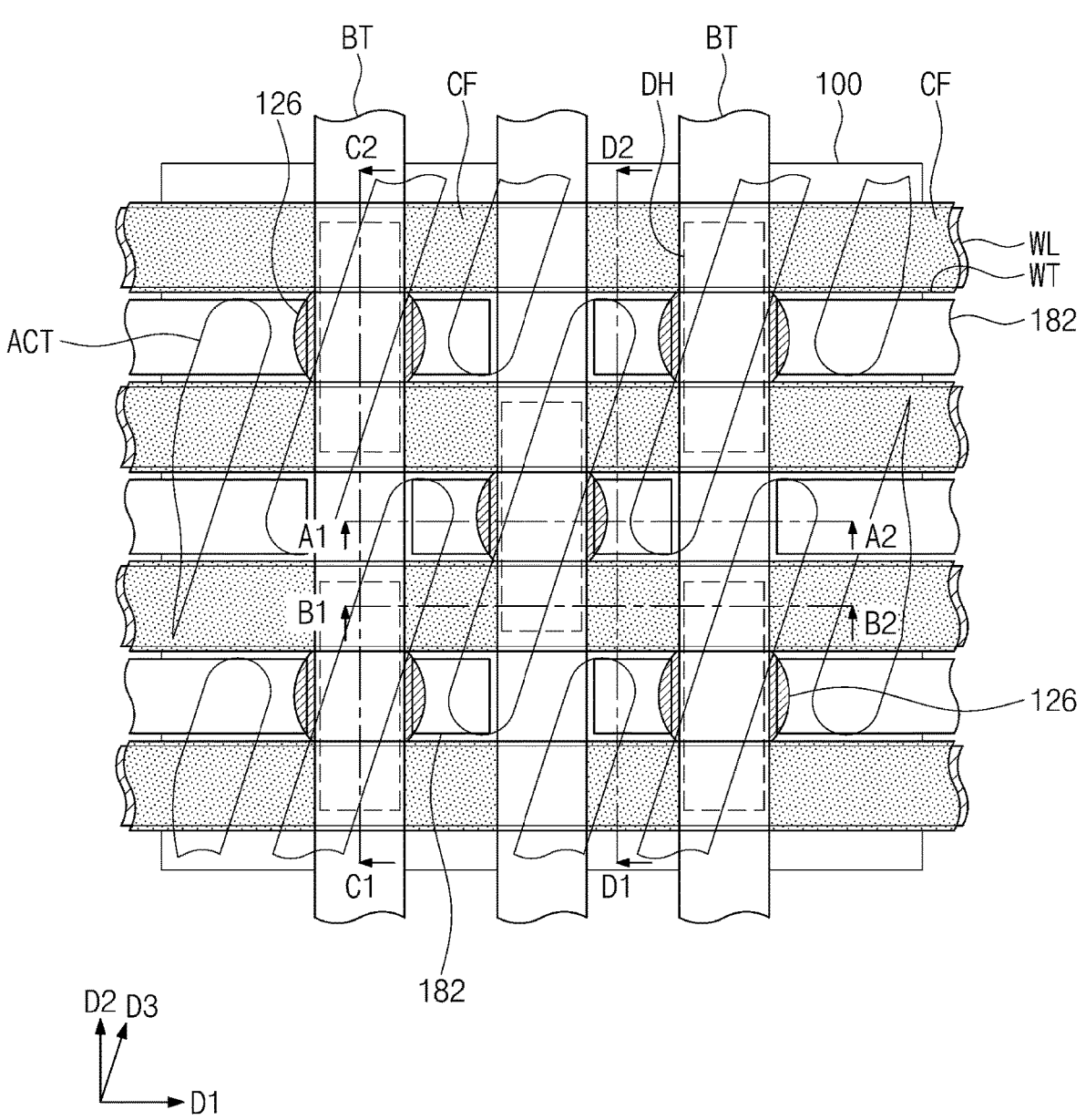
Figure 19:
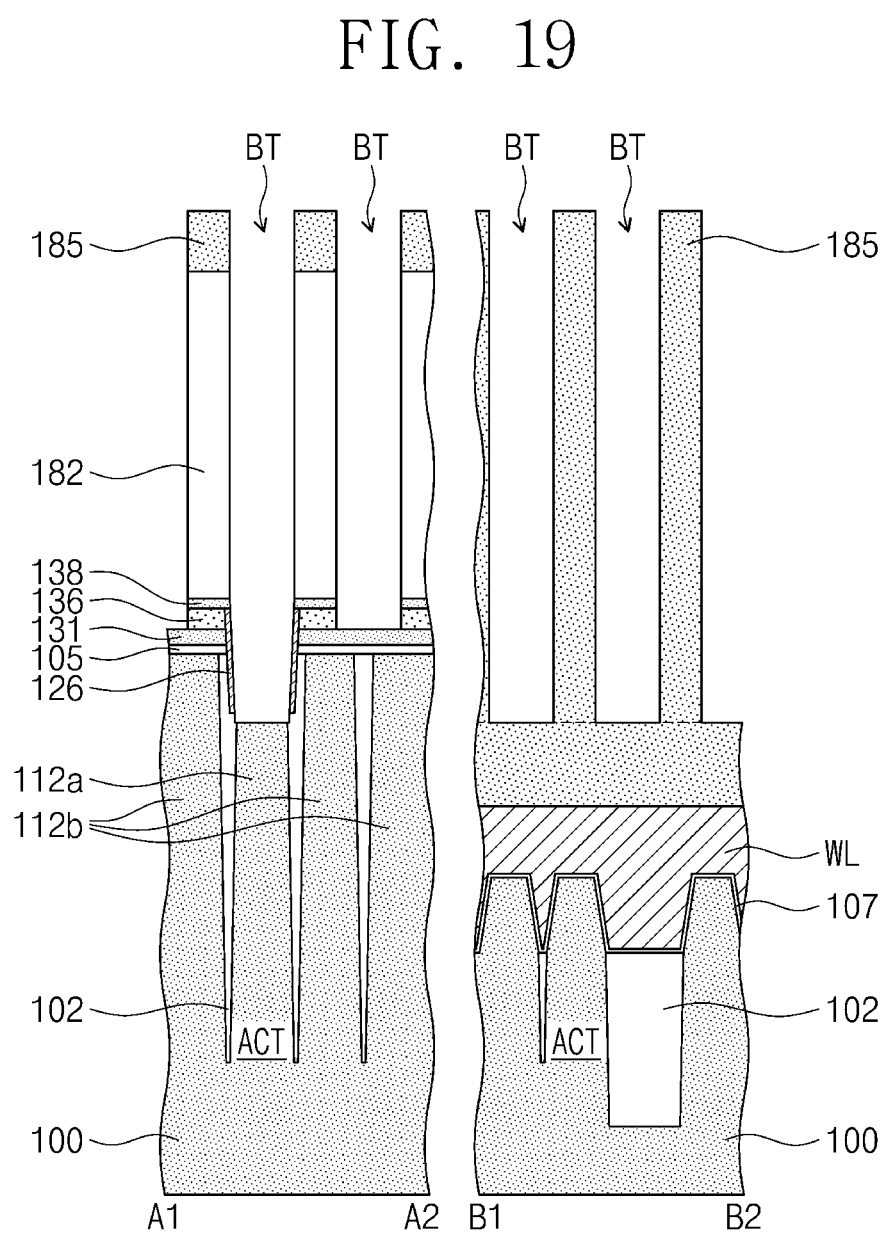
Figure 20:
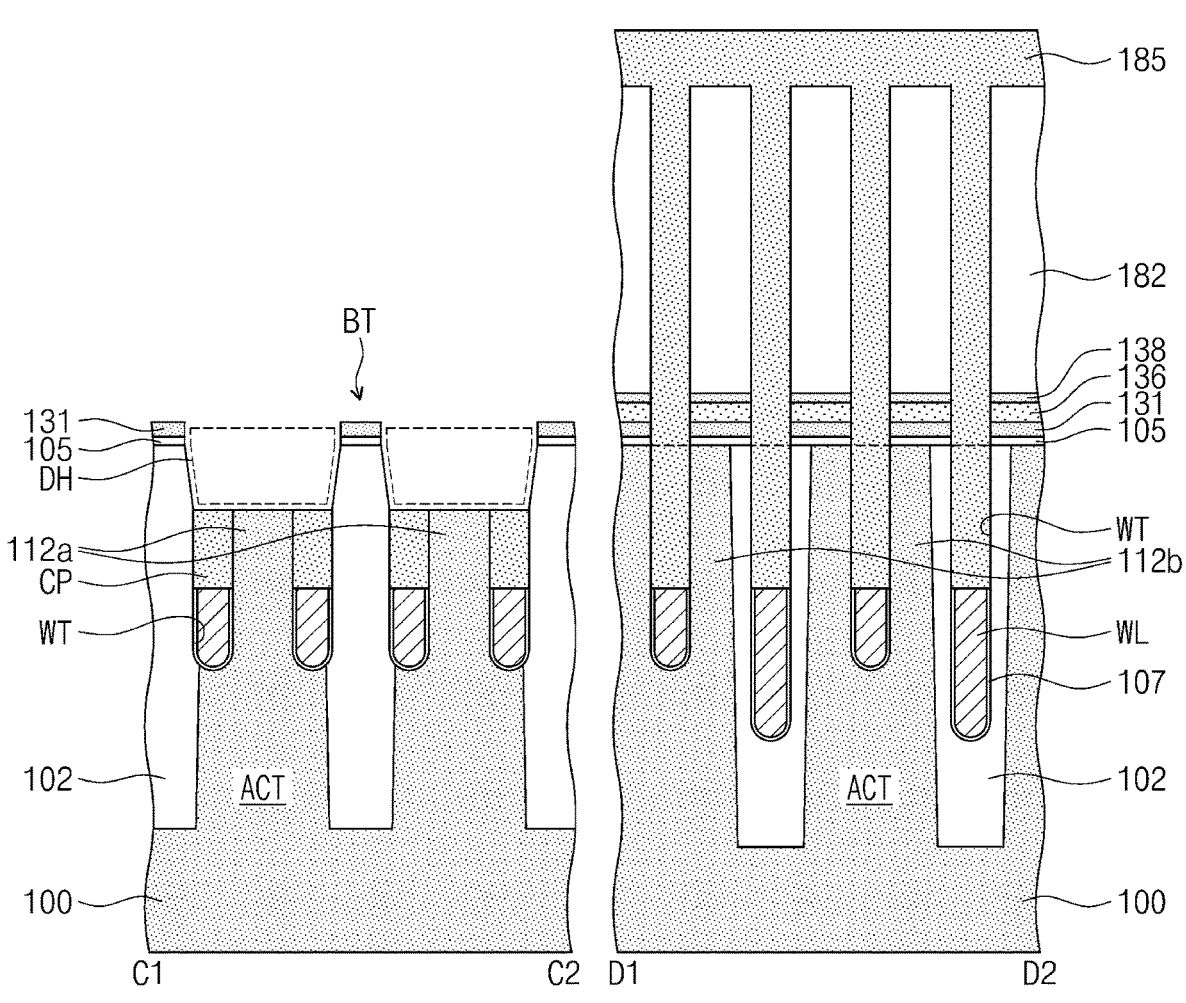

Referring to FIGS. 18 to 20, second trenches BT may extend in a second direction D2 while penetrating the intermediate dielectric layer 185, the preliminary mold patterns 181, the second etch stop layer 138, and the sacrificial dielectric patterns 125. The second trenches BT may be formed by an etching process that is performed until the first etch stop layer 136 is exposed. Afterwards, the first etch stop layer 136 which remains below the second trenches BT may be removed.

During the formation of the second trenches BT, the sacrificial dielectric patterns 125 may be removed to form second recess regions DH. For example, each of the second trenches BT may include a plurality of second recess regions DH in a lower portion thereof. A residual molding layer 126 may remain which is a residue of the sacrificial dielectric pattern 125 that is removed when the second recess region DH is formed. As shown in FIG. 18, the residual molding layer 126 may define sidewalls of the second recess region DH. The second recess regions DH may correspondingly expose the first impurity regions 112*a*. The second trenches BT may divide the preliminary mold patterns 181 into mold patterns 182 that are separated from each other in the first direction D1.

Figure 21:
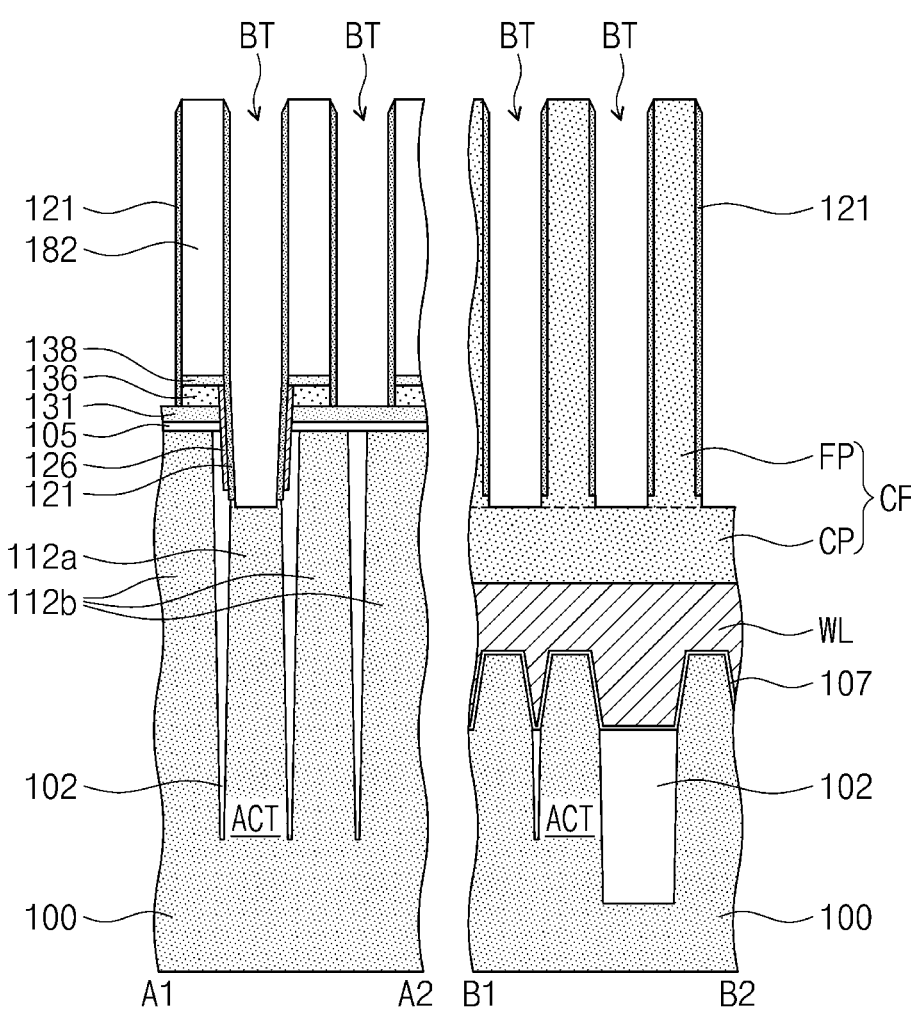
Figure 22:
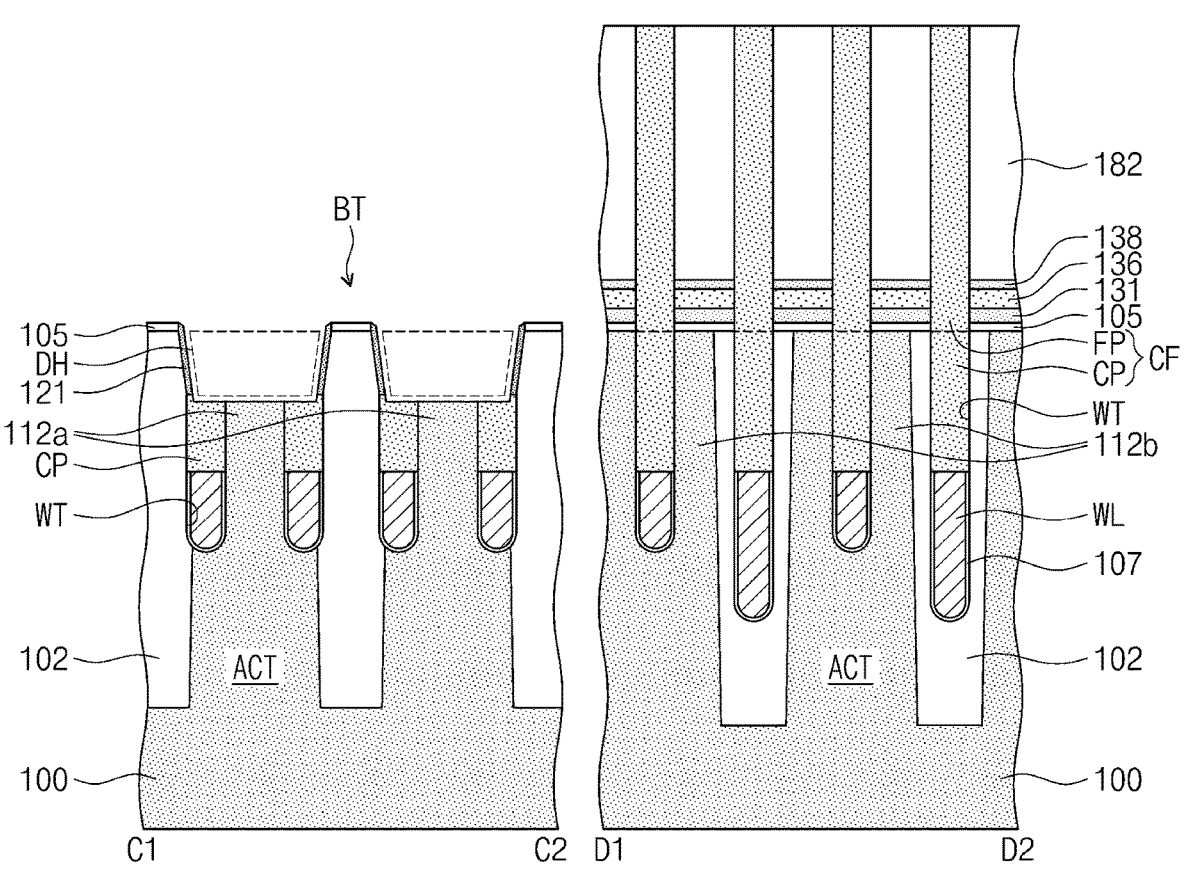

Referring to FIGS. 18, 21, and 22, spacers 121 may cover inner sidewalls of the second trenches BT. The formation of the spacers 121 may cause the second trenches BT to have their bottom surfaces lowered. During the formation of the spacers 121, at least a portion of the second buffer dielectric layer 131 may be removed. The spacers 121 may include, for example, a silicon nitride layer, a silicon oxide layer, and/or a silicon oxynitride layer. For example, the spacers 121 may include a first silicon nitride layer, a silicon oxide layer, and a second silicon nitride layer. The spacers 121 may cover inner sidewalls of the second recess regions DH.

The intermediate dielectric layer 185 may be changed into intermediate dielectric patterns CF that are separated from each other in the second direction D2. Each of the intermediate dielectric patterns CF may include a capping part (or "cap") CP and fence parts (or "fence") FP. The capping part CP may extend in the first direction D1 and may connect to each other a plurality of fence parts FP that are spaced apart from each other across the second trenches BT.

Figure 23:
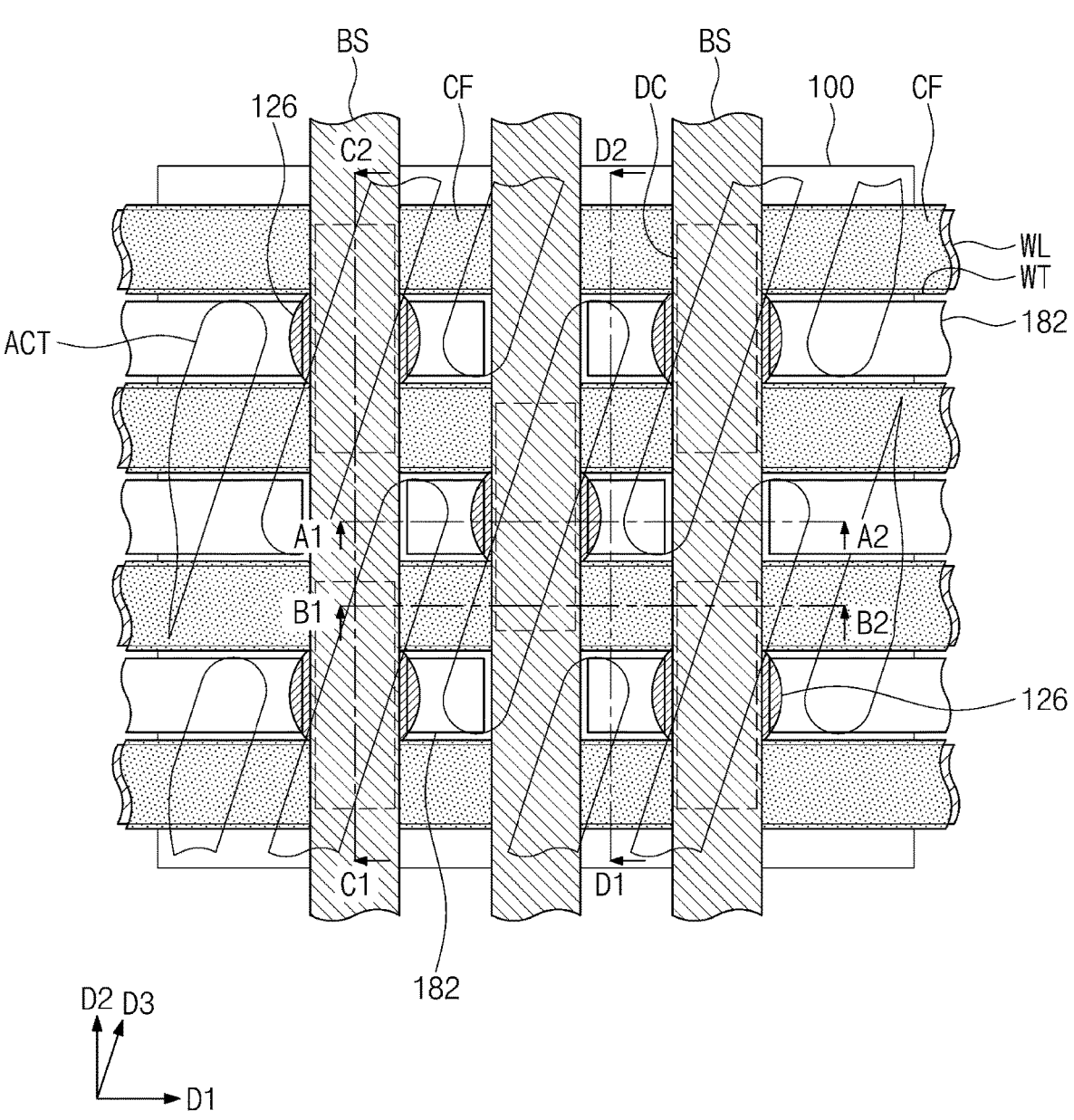
Figure 24:
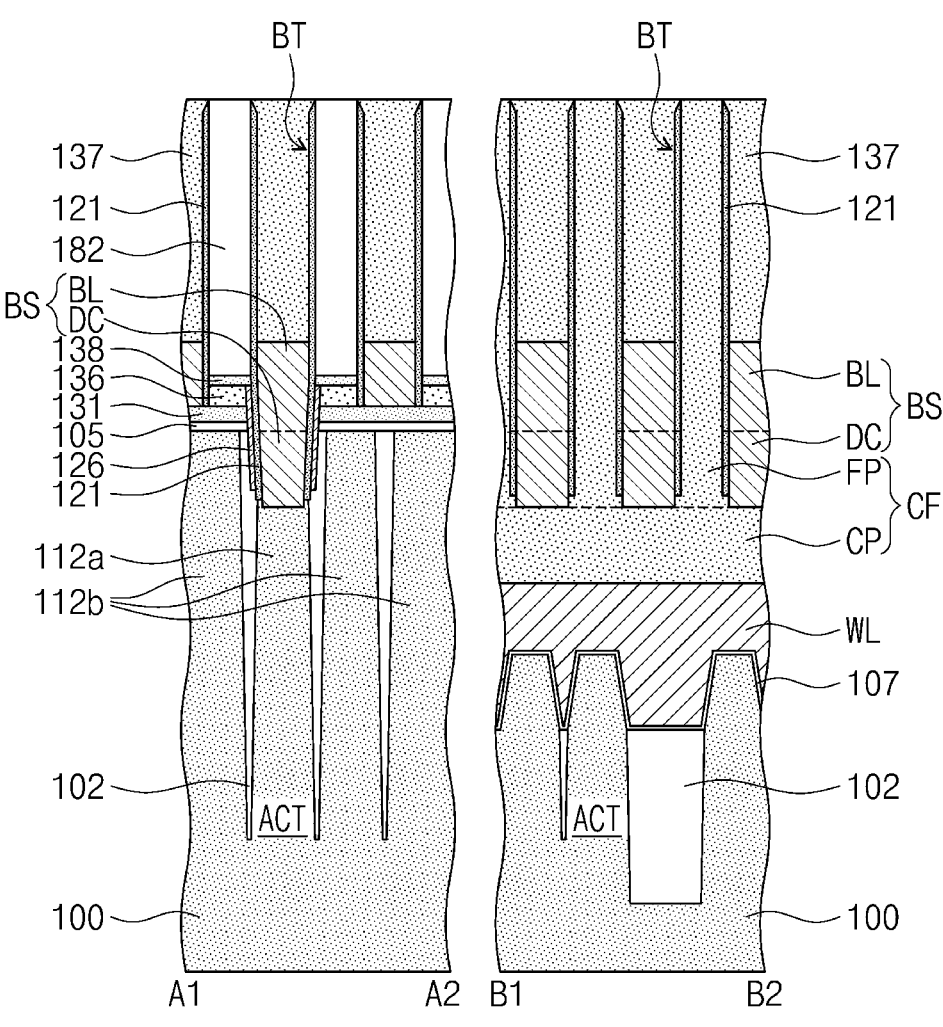
Figure 25:
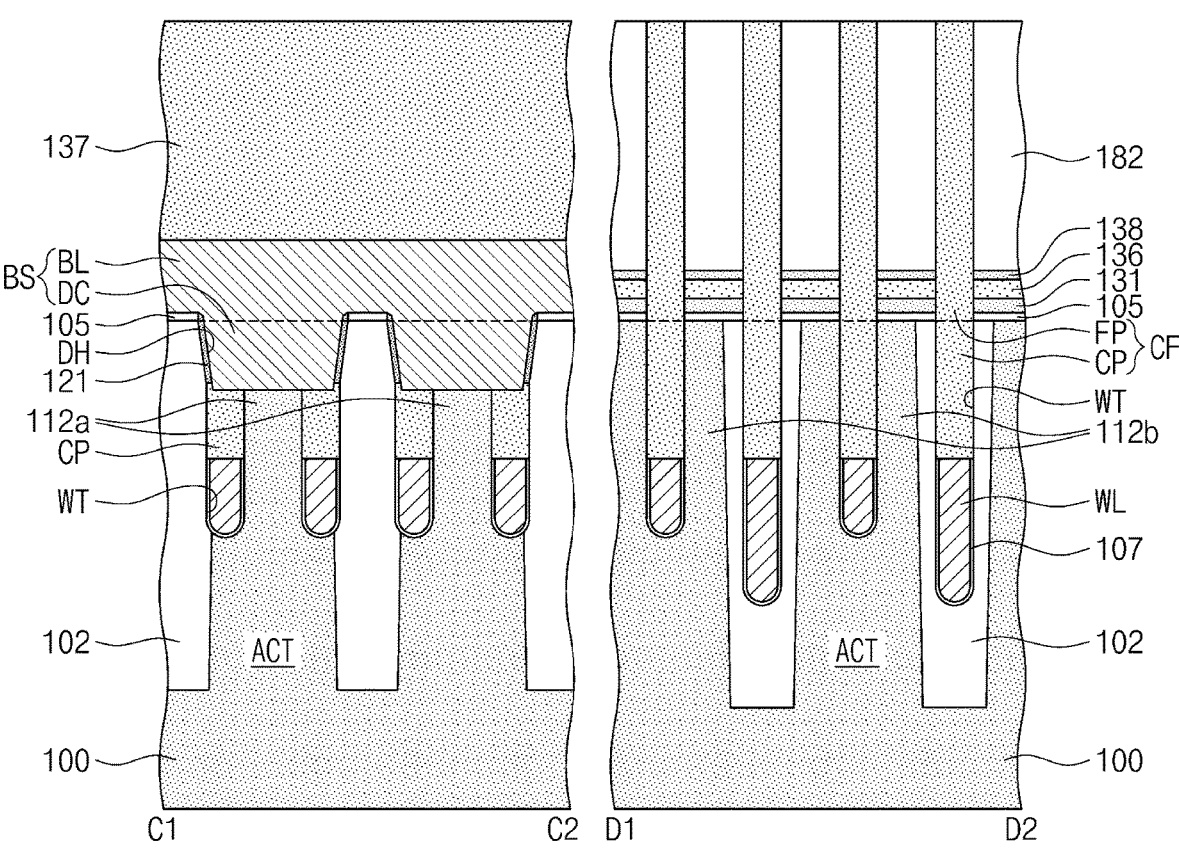

Referring to FIGS. 23 to 25, bit-line structures BS may correspondingly fill lower portions of the second trenches BT. The bit-line structures BS may be formed by a damascene process. For example, a metal layer may fill the second trenches BT, and then an etch-back process may be performed to form the bit-line structures BS.

Each of the bit-line structures BS may include contact parts DC connected to the first impurity regions 112a and may also include a line part BL that extends in the second direction D2 and is connected in common to a plurality of contact parts DC. The bit-line structures BS may be formed of tungsten, titanium, and/or tantalum. As shown in FIGS. 3B to 3D, one or both of a barrier layer 171 and a metal silicide layer 172 may be additionally formed. For example, the metal silicide layer 172 may be formed by depositing a metal layer and then performing an annealing process. After that, a non-reacted metal layer may be removed.

Bit-line capping patterns 137 may fill unoccupied portions of the second trenches BT. For example, the bit-line capping patterns 137 may be formed of a dielectric material, such as silicon nitride. After the formation of the bit-line capping patterns 137, a planarization process may be performed to expose the mold patterns 182.

Figure 26:
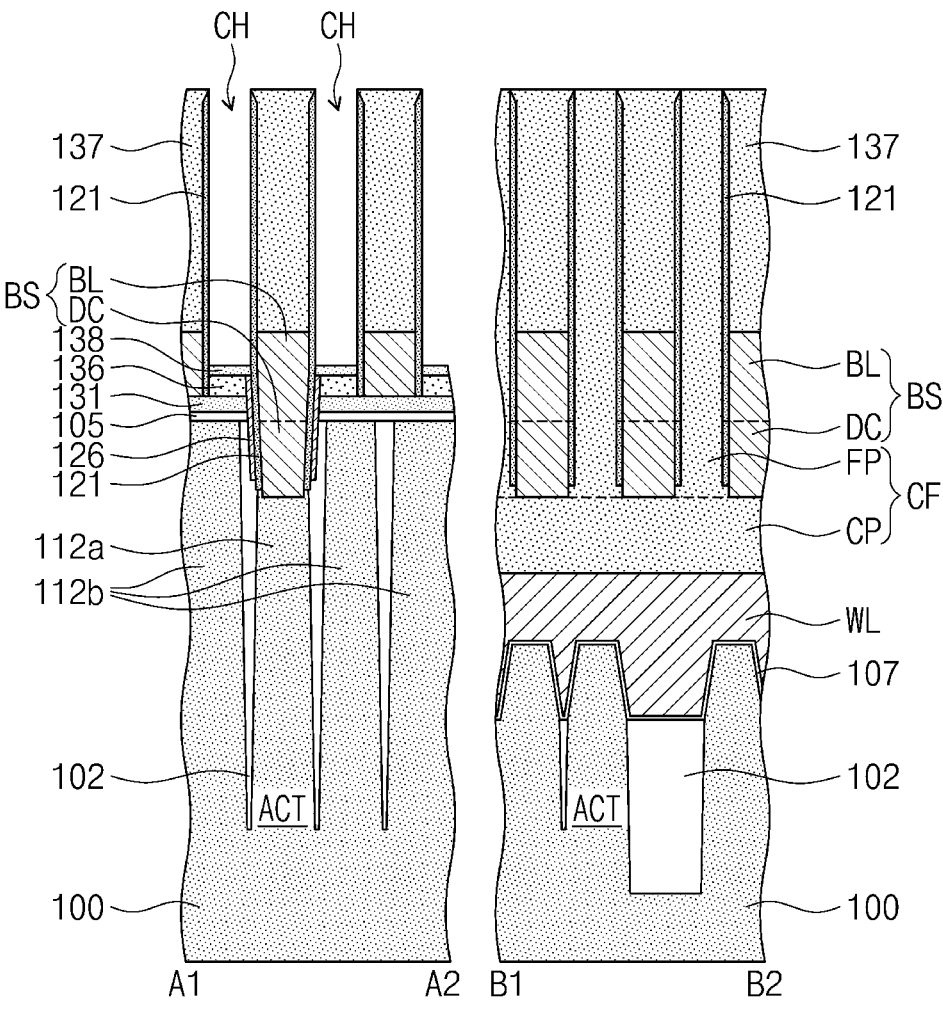
Figure 27:
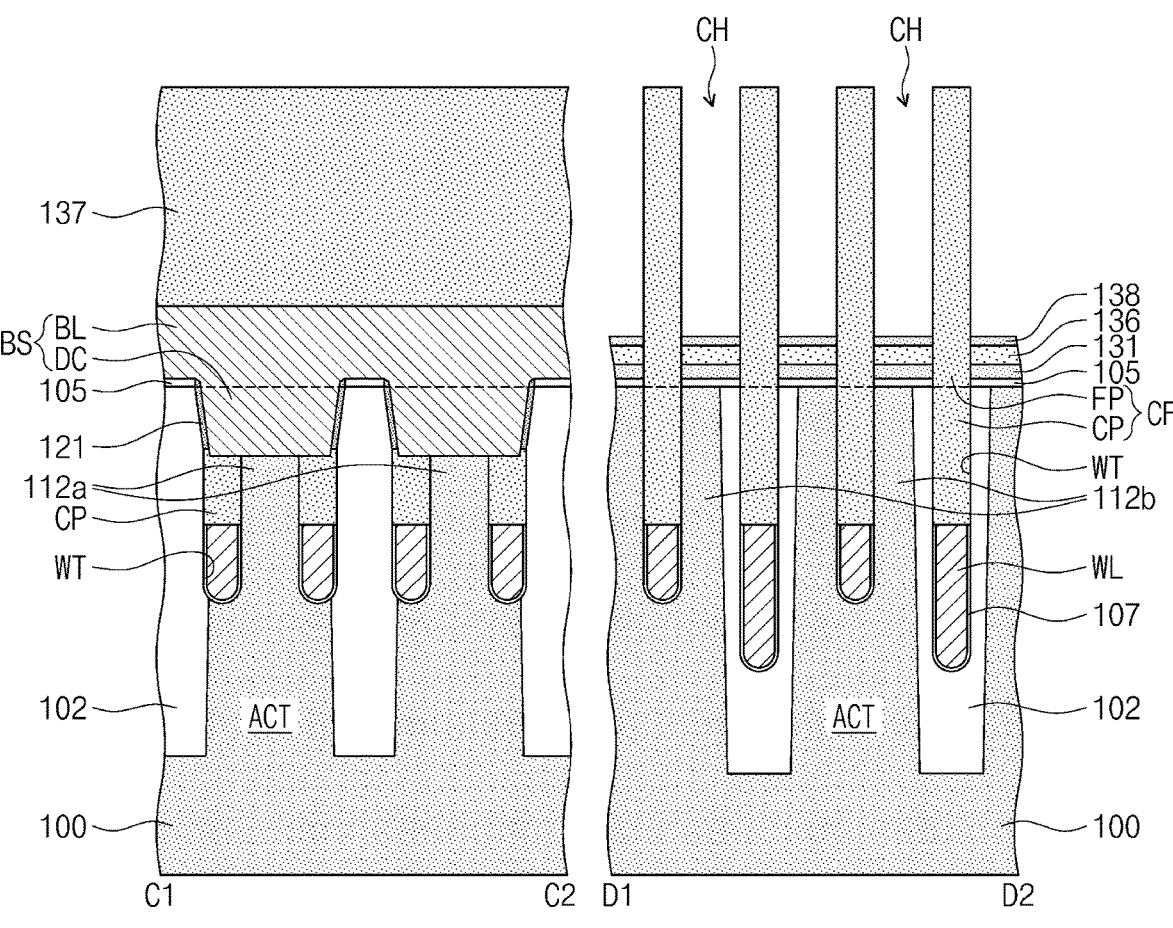

Referring to FIGS. 26 and 27, the mold patterns 182 may be selectively removed to form contact holes CH. The contact holes CH may expose the second etch stop layer 138. The contact holes CH may be defined by the bit-line capping patterns 137 and the fence parts FP.

Figure 28:
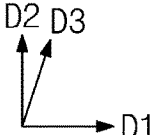
Figure 29:
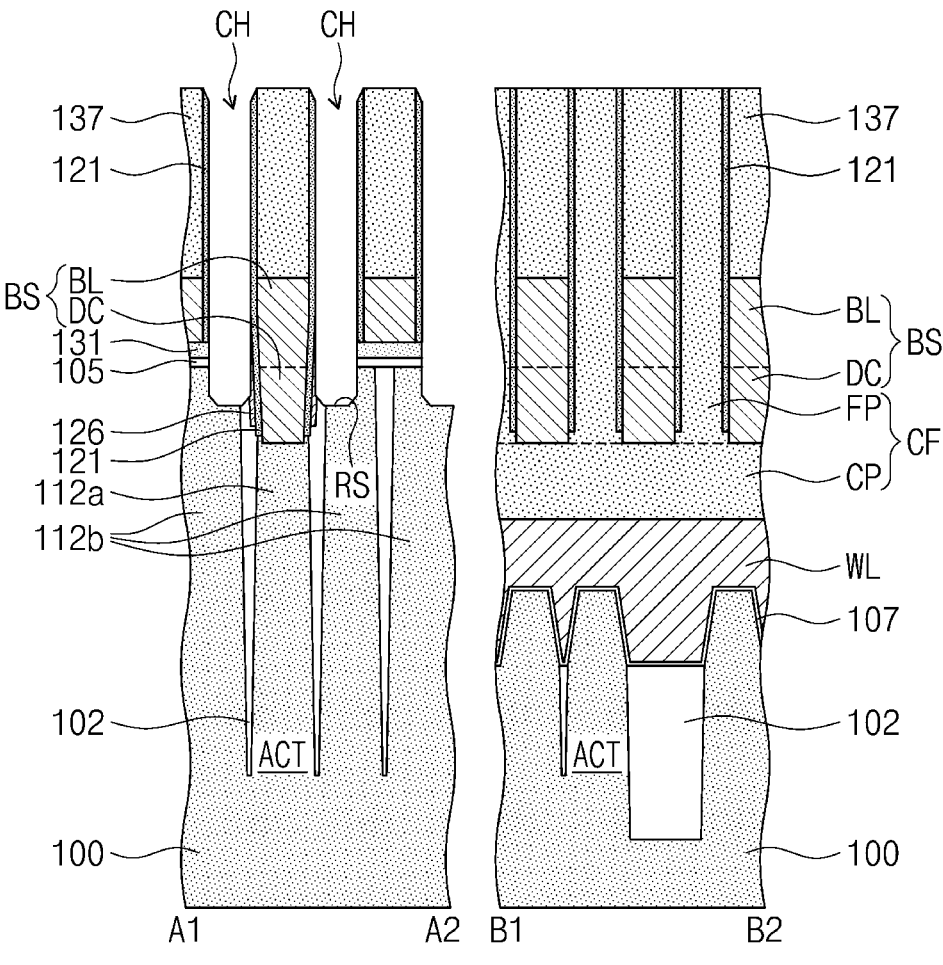
Figure 30:
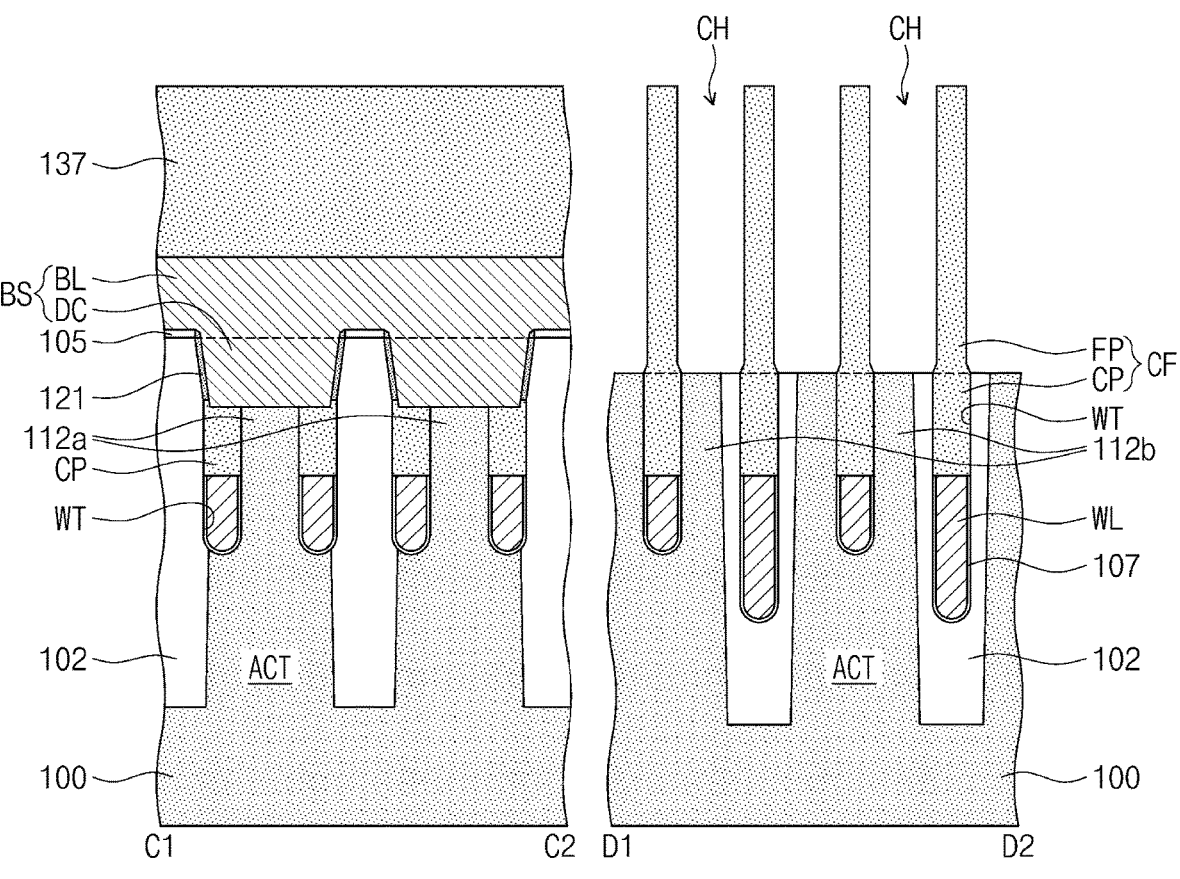

Referring to FIGS. 28 to 30, there may be formed third recess regions RS where the contact holes CH extend in a direction toward the substrate 100. The bit-line capping patterns 137 and the fence parts FP may be used as a mask to form the third recess regions RS. The third recess regions RS may expose the second impurity regions 112b. Widths in the second direction D2 of the fence parts FP may become reduced during the formation of the third recess regions RS. In addition, a portion of the residual molding layer 126 may be removed during the formation of the third recess regions RS.

Figure 31:
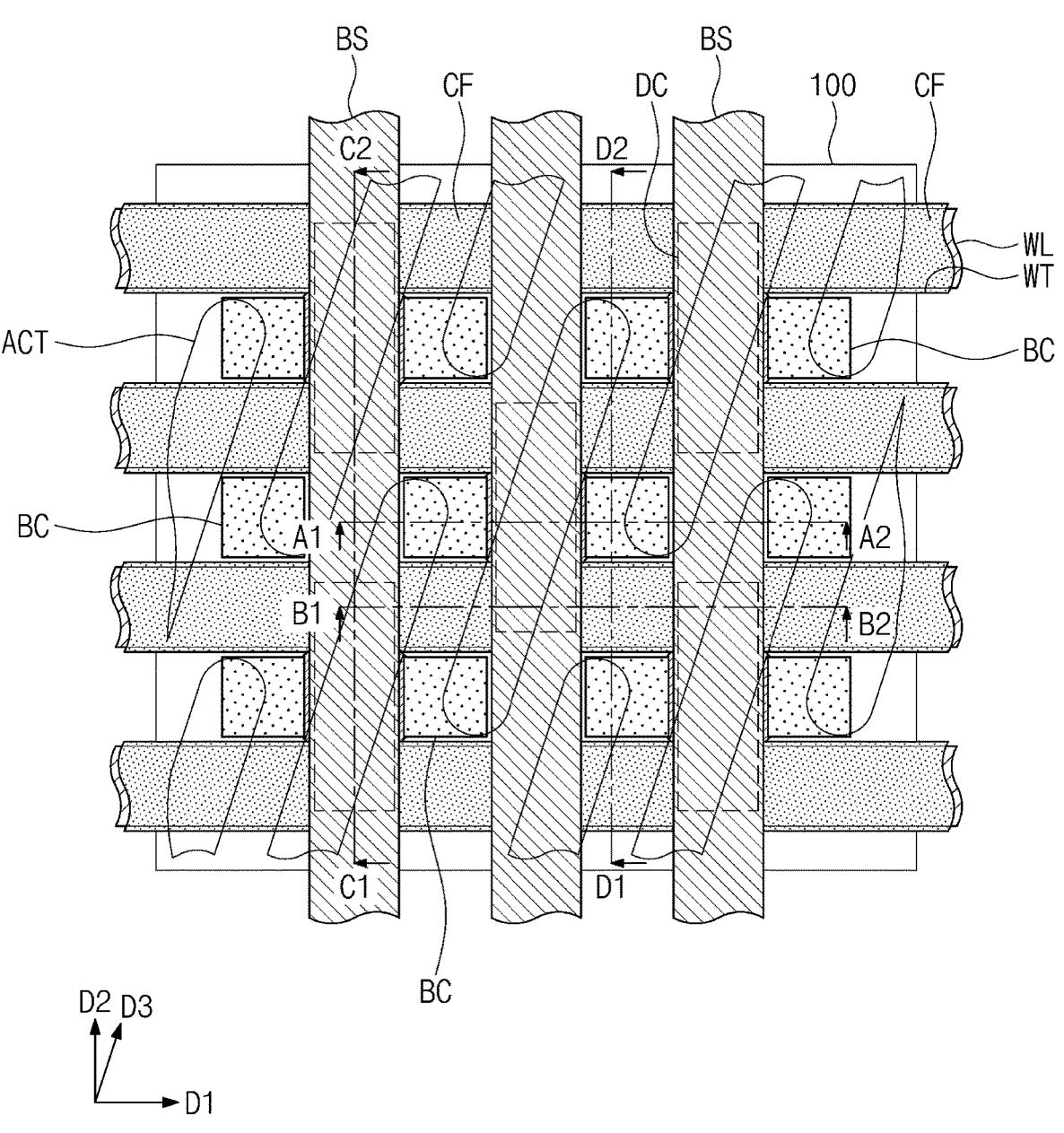
Figure 32:
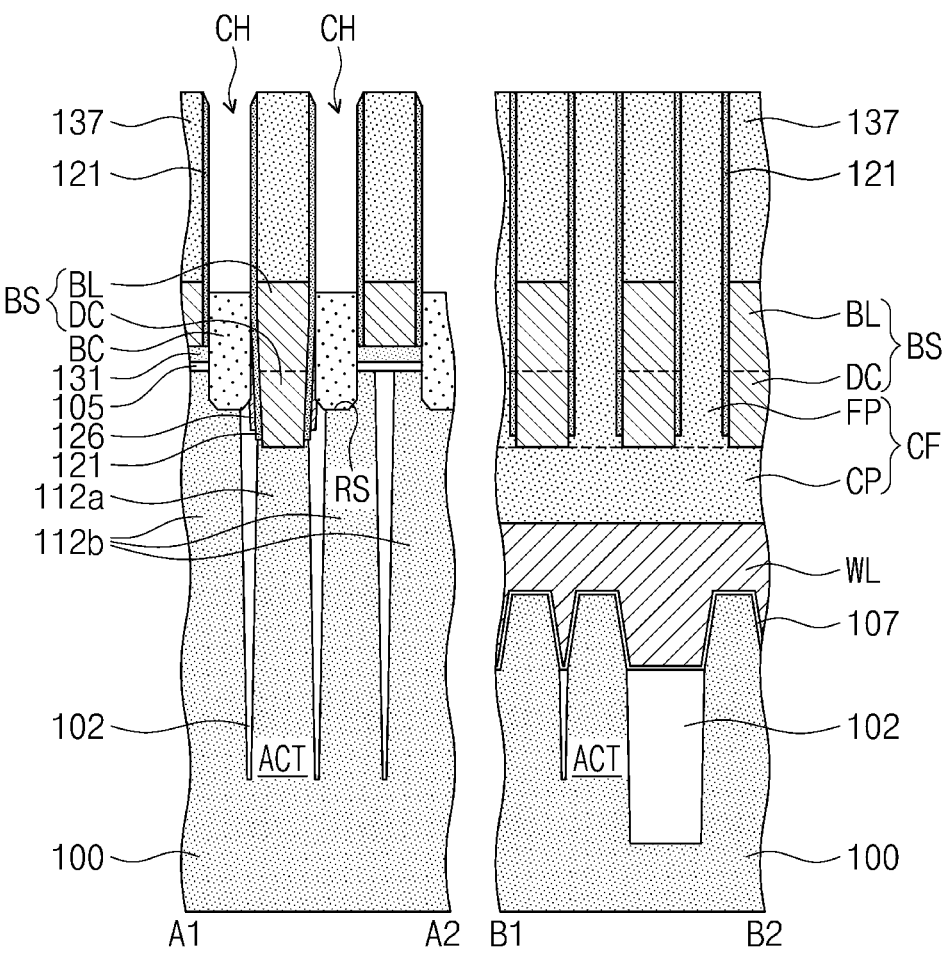
Figure 33:
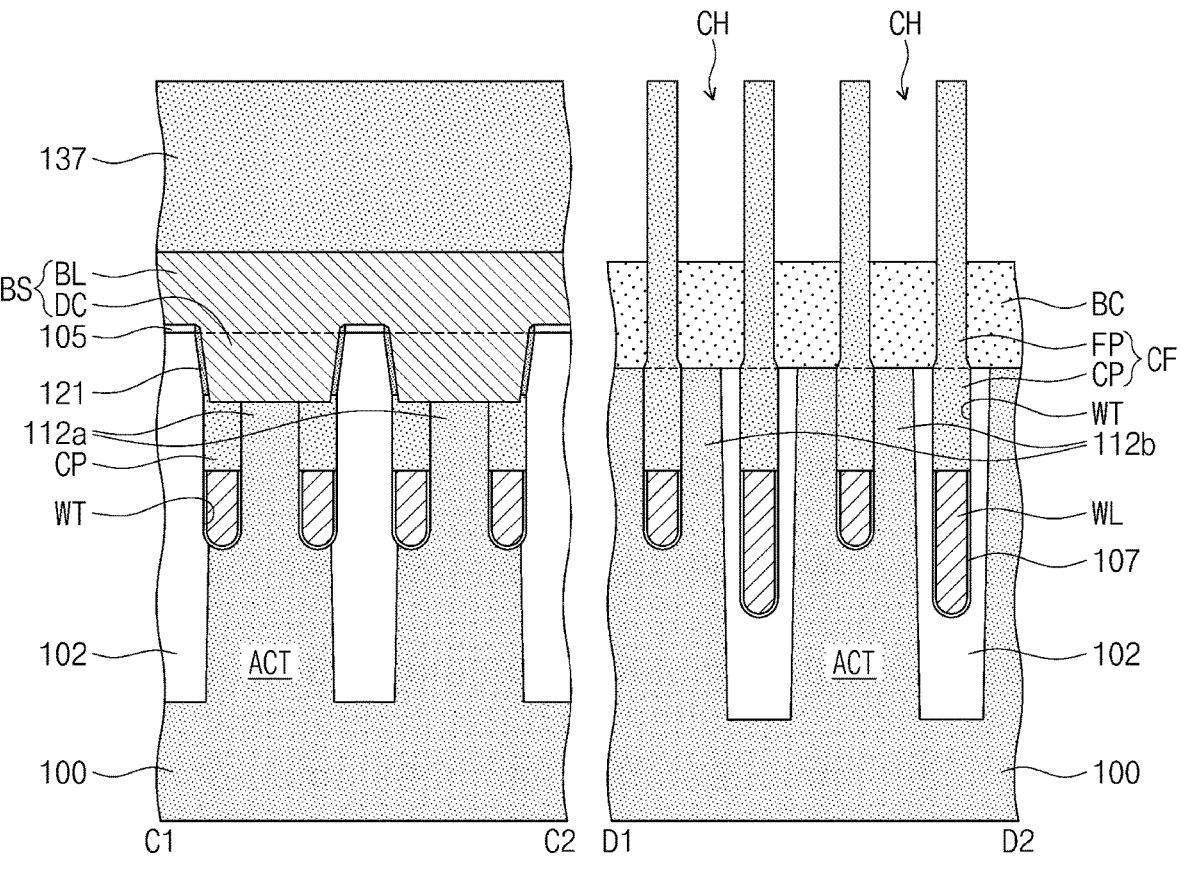

Referring to FIGS. 31 to 33, contact plugs BC may fill lower portions of the contact holes CH. The contact plugs BC may be formed of impurity-doped polysilicon, impurity-undoped polysilicon, or metal. For example, after a polysilicon layer is formed to fill the contact holes CH, an etch-back process may be performed to form the contact plugs BC.

Figure 34:
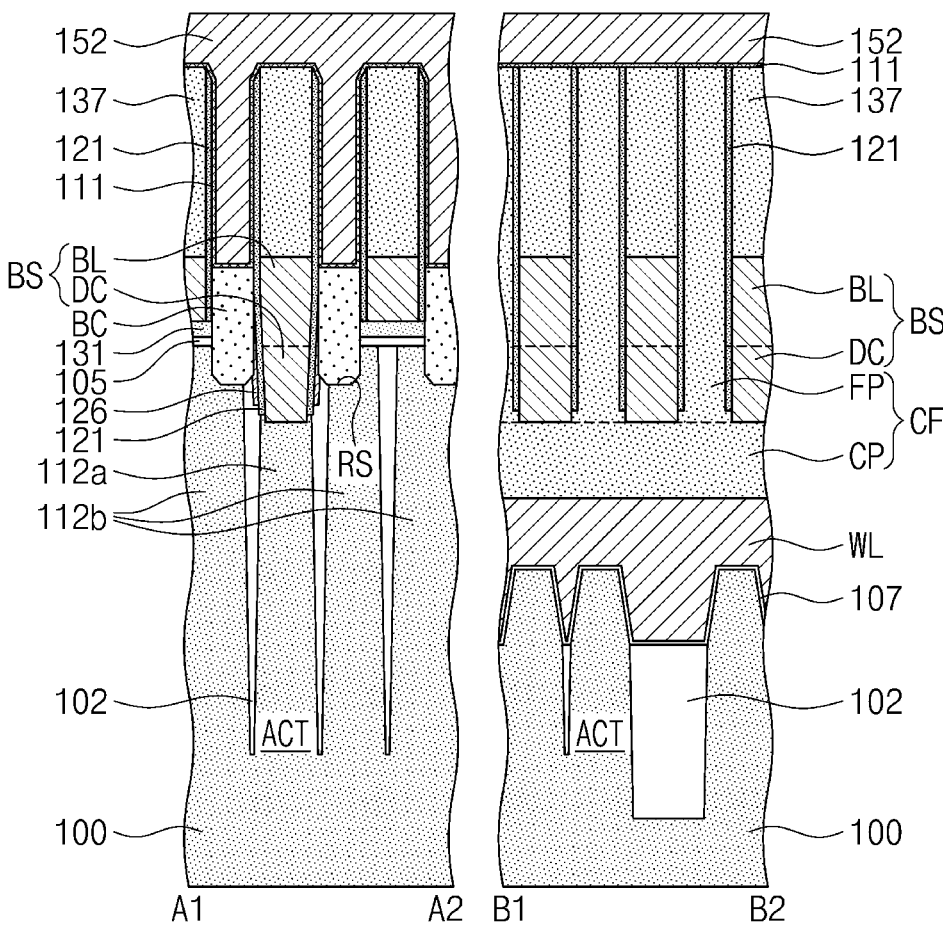
Figure 35:
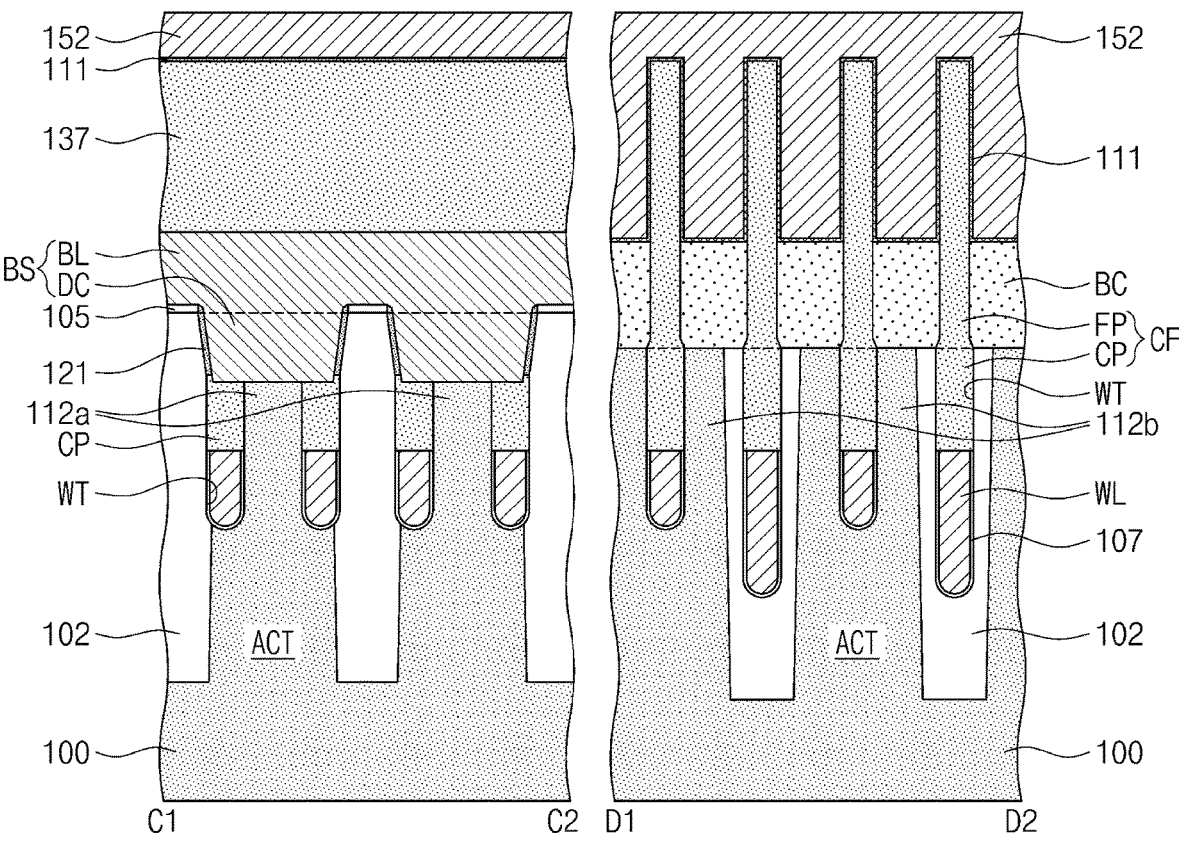

Referring to FIGS. 34 and 35, a diffusion stop layer 111 and a landing pad layer 152 may be sequentially formed to fill upper portions of the contact holes CH and to cover the bit-line capping patterns 137 and the fence parts FP. The diffusion stop layer 111 may include conductive metal nitride, such as tungsten nitride, titanium nitride, or tantalum nitride. The landing pad layer 152 may be, for example, a tungsten layer. In some embodiments, before the diffusion stop layer 111 is formed, metal such as cobalt, nickel, and/or titanium may be deposited on top surfaces of the contact plugs BC, and then an annealing process may be performed to form an ohmic layer of metal silicide.

Figure 36:
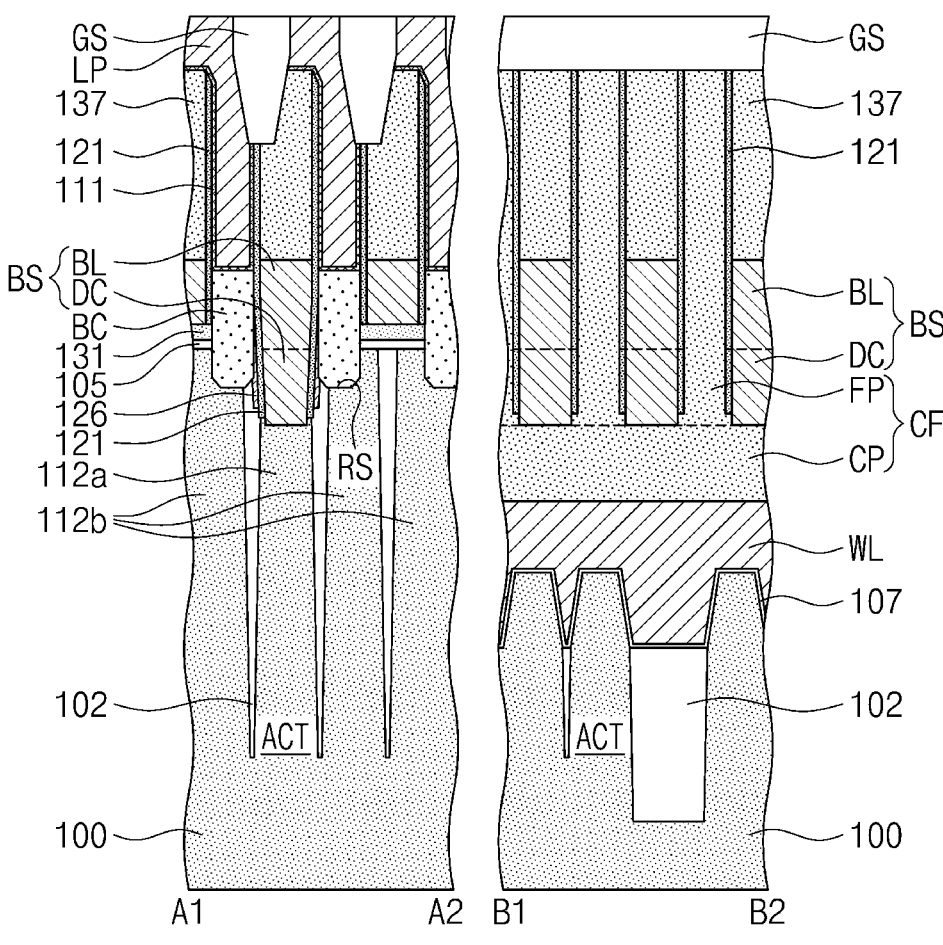
Figure 37:
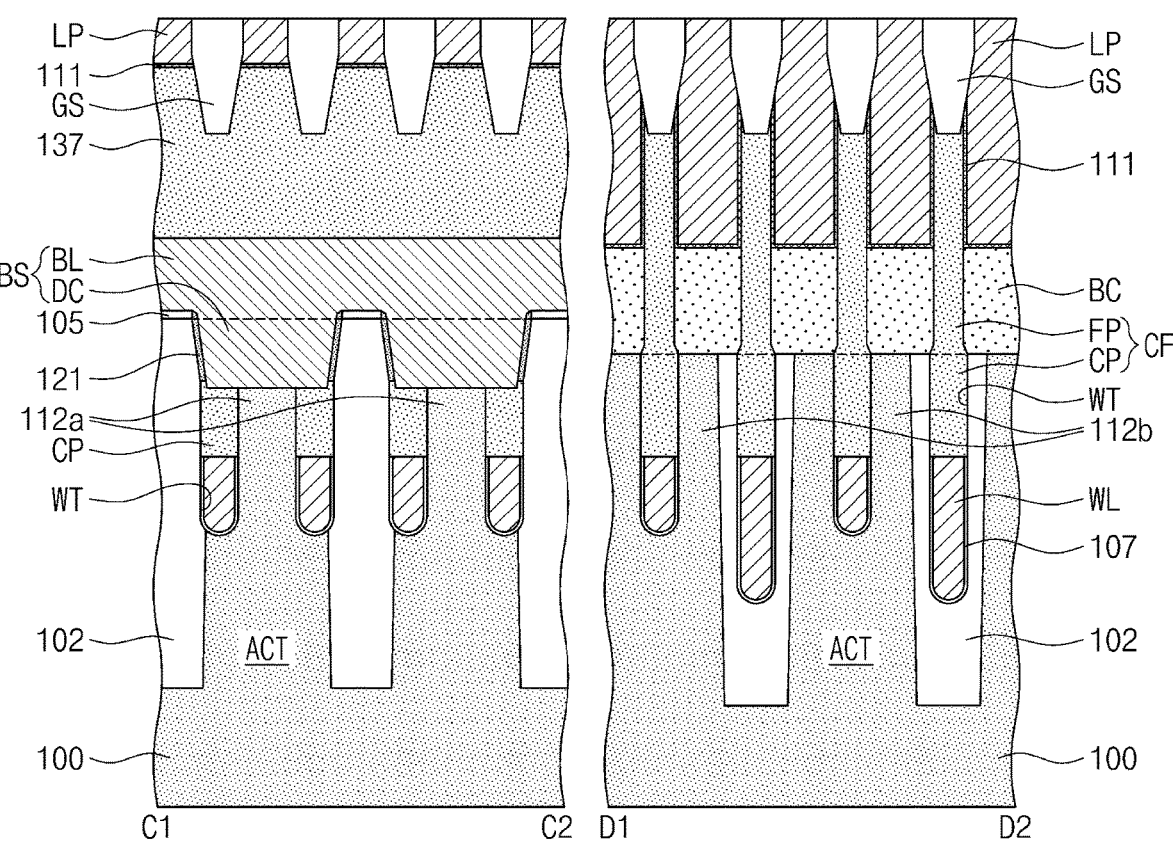

Referring to FIGS. 36 and 37, an anisotropic etching process may be performed to remove a portion of the landing pad layer 152 to form a recess region. Therefore, there may be formed landing pads LP that are separated from each other. A portion of the diffusion stop layer 111 may be removed during the formation of the landing pad layer 152. In addition, upper portions of the bit-line capping patterns 137 and upper portions of the spacers 121 may be removed during the formation of the landing pad layer 152. A gap-fill structure GS may fill a space between the landing pads LP that are separated from each other. The gap-fill structure GS may be formed of one or both of a silicon nitride layer and a silicon oxynitride layer.

Referring back to FIGS. 1, 2A, and 2B, data storage elements DS may be formed on corresponding landing pads LP. For example, bottom electrodes may be formed on corresponding landing pads LP, and then a dielectric layer and a top electrode may sequentially cover the bottom electrodes.

According to some embodiments of the present inventive concepts, there may be provided a bit-line structure in which a contact part and a line part are integrally connected into a single unitary piece. The bit-line structure of the present inventive concepts may be formed of a metallic material to reduce resistance, compared to a case where a semiconductor material is used to form a contact that connects a bit line to an impurity region. In addition, it may be possible to reduce the number of process steps and to avoid process failure issues that can occur when the contact and the bit line are formed individually.

According to some embodiments of the present inventive concepts, intermediate dielectric patterns, each including a capping part and fence parts, may be used as a mold for forming contact plugs. Therefore, a semiconductor memory device may be fabricated without additionally forming, between bit-line structures, fence structures to define contact holes for forming the contact plugs.

This detailed description of the present inventive concepts should not necessarily be construed as limited to the embodiments set forth herein, and it is intended that the present inventive concepts cover the various combinations, the modifications and variations of the present disclosure without departing from the spirit and scope of the present inventive concepts.

What is claimed is:

1. A semiconductor memory device, comprising:
a plurality of active sections disposed on a substrate, the plurality of active sections includes a plurality of first impurity regions and a plurality of second impurity regions, each of the plurality of active sections being defined by a device isolation layer;

a plurality of word lines that extend in a first direction, over the plurality of active sections;

a plurality of intermediate dielectric patterns that correspondingly cover top surfaces of the plurality of word lines;

a plurality of bit-line structures that extend in a second direction, over the plurality of word lines, the second direction intersecting the first direction;

a plurality of contact plugs disposed between the plurality of bit-line structures and connected to corresponding second impurity regions of the plurality of second impurity regions; and a plurality of data storage elements disposed on corresponding contact plugs of the plurality of contact plugs, wherein each of the plurality of intermediate dielectric patterns has a single-body structure that includes:

a cap that covers the top surfaces of the plurality of word lines and is buried within the substrate; and a plurality of fences that extend between the plurality of bit-line structures from the cap, wherein each of the plurality of fences includes a first portion between the contact plugs, the first portion has a first width in the second direction between the contact plugs, wherein the cap includes a second portion below the first portion, the second portion has a second width in the second direction, wherein the first width is less than the second width.

2. The device of claim 1, wherein the plurality of contact plugs are disposed in areas defined by the plurality of fences and the plurality of bit-line structures.

3. The device of claim 1, further comprising a plurality of spacers disposed between the plurality of contact plugs and the plurality of bit-line structures, wherein the plurality of spacers extend between the plurality of fences and the plurality of bit-line structures.

4. The device of claim 1, wherein top surfaces of the plurality of fences are higher than top surfaces of the plurality of bit-line structures.

5. The device of claim 1, wherein each of the plurality of bit-line structures includes:

a plurality of contacts buried in an upper portion of the substrate and connected to corresponding first impurity regions of the plurality of first impurity regions; and a line that extends in the second direction and is connected in common to the plurality of contacts.

6. The device of claim 5, wherein the plurality of contacts and the line are portions of a single layer that is formed of a same material.

7. The device of claim 5, further comprising a plurality of spacers that cover sidewalls of the plurality of bit-line structures, wherein each of the plurality of spacers includes:

a first section that covers a first sidewall of one of the plurality of bit-line structures;

a second section that covers a second sidewall of the one of the plurality of bit-line structures, the second sidewall being opposite to the first sidewall; and a third section that covers sidewalls of the plurality of contacts below the line and connects the first section and the second section to each other.

8. The device of claim 5, further comprising a plurality of spacers that cover sidewalls of the plurality of bit-line structures, wherein bottom surfaces of the plurality of contacts are lower than bottom surfaces of the plurality of spacers.

9. The device of claim 5, wherein a width in the first direction at a top surface of the line is greater than a width in the first direction at a bottom surface of one of the plurality of contacts.

10. A semiconductor memory device, comprising:

a plurality of active sections disposed on a substrate, the plurality of active sections includes a plurality of first impurity regions and a plurality of second impurity regions, each of the plurality of active sections being defined by a device isolation layer;

a plurality of word lines that extend in a first direction, over the plurality of active sections;

a plurality of bit-line structures disposed on the plurality of word lines, each of the plurality of bit-line structures extending in a second direction, the second direction intersecting the first direction;

a plurality of contact plugs disposed between the plurality of bit-line structures and connected to corresponding second impurity regions of the plurality of second impurity regions;

a plurality of intermediate dielectric patterns that correspondingly cover top surfaces of the plurality of word lines, wherein each of the plurality of intermediate dielectric patterns has a single-body structure that includes a plurality of fences extends beyond the plurality of bit-line structures in a first cross-section parallel to the first direction, beyond the plurality of contact plugs in a second cross-section parallel to the second direction, or both;

a plurality of spacers disposed between the plurality of contact plugs and the plurality of bit-line structures; and a plurality of data storage elements disposed on corresponding contact plugs of the plurality of contact plugs, wherein each of the plurality of bit-line structures includes:

a plurality of contacts buried in an upper portion of the substrate and connected to corresponding first impurity regions of the plurality of first impurity regions; and a line that extends in the second direction and is connected in common to the plurality of contacts, wherein a bottom surface of at least one of the plurality of contacts is at a level that is lower than levels of bottom surfaces of the plurality of spacers.

11. The device of claim 10, wherein the plurality of contacts and the line are portions of a single layer that is formed of a same material.

12. The device of claim 10, further comprising a metal silicide layer disposed between the plurality of contacts and the plurality of first impurity regions.

13. The device of claim 10, further comprising a conductive metal nitride layer disposed between the plurality of contacts and the plurality of first impurity regions.

14. The device of claim 10, wherein each of the plurality of spacers includes:

a first section that covers a first sidewall of one of the plurality of bit-line structures;

a second section that covers a second sidewall of the one of the plurality of bit-line structures, the second sidewall being opposite to the first sidewall; and a third section that covers sidewalls of the plurality of contacts below the line and connects the first section and the second section to each other.

15. The device of claim 10, wherein a width in the first direction at a top surface of the line is greater than a width in the first direction at a bottom surface of one of the plurality of contacts.

16. The device of claim 10, further comprising a plurality of intermediate dielectric patterns that correspondingly cover top surfaces of the plurality of word lines, wherein each of the plurality of intermediate dielectric patterns further includes:

a cap that covers the top surfaces of the plurality of word lines and is buried in the substrate, wherein the plurality of fences extend between the plurality of bit-line structures, from the cap.

17. The device of claim 16, wherein a width in the second direction of each of the plurality of fences is less than a width in the second direction of the cap.

18. The device of claim 16, wherein the cap and the plurality of fences are portions of a single layer that is formed of a same material.

19. A semiconductor memory device, comprising:

a plurality of active sections disposed on a substrate, the plurality of active sections including a plurality of first impurity regions and a plurality of second impurity regions, the plurality of active sections being defined by a device isolation layer;

a plurality of word lines that extend in a first direction on the plurality of active sections;

a gate dielectric layer disposed between the plurality of word lines and the plurality of active sections;

a plurality of intermediate dielectric patterns that correspondingly cover top surfaces of the plurality of word lines;

a plurality of bit-line structures that extend in a second direction on the plurality of word lines, the second direction intersecting the first direction;

a plurality of contact plugs disposed between the plurality of bit-line structures and connected to corresponding second impurity regions of the plurality of second impurity regions;

a plurality of landing pads disposed on the plurality of contact plugs;

a gap-fill structure that fills a space between landing pads of the plurality of landing pads; and a capacitor connected to the plurality of second impurity regions through the plurality of contact plugs and the plurality of landing pads, wherein each of the plurality of intermediate dielectric patterns has a single-body structure that includes:

a cap that covers the top surfaces of the plurality of word lines and is buried in the substrate; and a plurality of fences that extend between the plurality of bit-line structures, from the cap, wherein the plurality of fences extends beyond the plurality of bit-line structures in a first cross-section parallel to the first direction, beyond the plurality of contact plugs in a second cross-section parallel to the second direction, or both.

* * * * *